United States Patent
Shinohara

(10) Patent No.: US 9,177,807 B2
(45) Date of Patent: Nov. 3, 2015

(54) MANUFACTURING METHOD OF SEMICONDUCTOR DEVICE

(71) Applicant: Renesas Electronics Corporation, Kawasaki-shi, Kanagawa (JP)

(72) Inventor: Hirofumi Shinohara, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 139 days.

(21) Appl. No.: 14/133,605

(22) Filed: Dec. 18, 2013

(65) Prior Publication Data

US 2014/0179076 A1    Jun. 26, 2014

(30) Foreign Application Priority Data

Dec. 25, 2012 (JP) ................. 2012-281681

(51) Int. Cl.
| | |
|---|---|
| *H01L 21/8234* | (2006.01) |
| *H01L 21/28* | (2006.01) |
| *H01L 29/423* | (2006.01) |
| *H01L 29/66* | (2006.01) |
| *H01L 29/792* | (2006.01) |
| *H01L 27/115* | (2006.01) |

(52) U.S. Cl.
CPC .. *H01L 21/28273* (2013.01); *H01L 21/823462* (2013.01); *H01L 21/823468* (2013.01); *H01L 27/11573* (2013.01); *H01L 29/42344* (2013.01); *H01L 29/66833* (2013.01); *H01L 29/792* (2013.01); *H01L 29/66545* (2013.01)

(58) Field of Classification Search
CPC ................. H01L 21/28273; H01L 21/823462; H01L 21/823468; H01L 29/42344; H01L 29/66833; H01L 29/792; H01L 27/11573

USPC .......................................................... 438/275
See application file for complete search history.

(56) References Cited

U.S. PATENT DOCUMENTS 6,417,086 B1 * 7/2002 Osari ............................ 438/594
6,465,290 B1 * 10/2002 Suguro et al. ................. 438/183

(Continued)

FOREIGN PATENT DOCUMENTS

| JP | 2000-243937 A | 9/2000 |
|---|---|---|
| JP | 2006-245167 A | 9/2006 |

(Continued)

*Primary Examiner* — Minh-Loan Tran
*Assistant Examiner* — Farid Khan
(74) *Attorney, Agent, or Firm* — Miles & Stockbridge P.C.

(57) ABSTRACT

Even when a semiconductor device having field effect transistors driven by relatively different power supply voltages provided over a semiconductor substrate is manufactured by the gate-last process, the breakdown voltage of the transistor on the higher voltage side can be ensured.

When forming, over the substrate by the gate-last process, a MOSFET of a core region driven by a first power supply voltage and a MOSFET of a high-voltage region driven by a second power supply voltage higher than the first power supply voltage, the thickness of the hard mask film formed over a dummy gate film of the high-voltage region is made thicker than that of the hard mask film formed over a dummy gate film of the core region, prior to a process of patterning a dummy gate of the MOSFET of the core region and the MOSFET of the high-voltage region. Thereby, the breakdown voltage of MOSFET of the high-voltage region can be ensured.

8 Claims, 27 Drawing Sheets

(56) References Cited

U.S. PATENT DOCUMENTS

| | | |
|---|---|---|
| 7,557,005 B2 | 7/2009 | Ishii et al. |
| 2006/0237788 A1* | 10/2006 | Ishimaru ................ 257/347 |
| 2007/0262382 A1* | 11/2007 | Ishii et al. ................ 257/350 |
| 2009/0039423 A1* | 2/2009 | Ikeda ................ 257/334 |
| 2009/0042348 A1* | 2/2009 | Yamamoto ................ 438/275 |

FOREIGN PATENT DOCUMENTS

| | | |
|---|---|---|
| JP | 2007-150321 A | 6/2007 |
| JP | 2007-305711 A | 11/2007 |

* cited by examiner

MANUFACTURING METHOD OF SEMICONDUCTOR DEVICE

CROSS-REFERENCE TO RELATED APPLICATION

The disclosure of Japanese Patent Application No. 2012-281681 filed on Dec. 25, 2012 including the specification, drawings and abstract is incorporated herein by reference in its entirety.

BACKGROUND

The present invention relates to a manufacturing method of a semiconductor device and can be preferably applied, for example, to a manufacturing method of a semiconductor device which uses, when forming field effect transistors with different power supply voltages over a semiconductor substrate, a gate-last process of forming a gate electrode after having performed heat treatment to activate the semiconductor region for the source and drain.

A semiconductor device such as an MCU (Micro Controller Unit) or an SoC (System on Chip) has a high-voltage MOSFET (Metal Oxide Semiconductor Field Effect Transistor) driven by a high power supply voltage and a core MOSFET driven by a low power supply voltage formed over a semiconductor substrate.

The gate length of a core MOSFET is being reduced every year for a higher performance, a higher functionality and a higher integration, and for an advanced product using a planar core MOSFET, the gate length has attained 20 to 40 nm. In addition, the most advanced product with a three-dimensional gate structure has attained a gate length shorter than 20 nm.

On the other hand, there is a demand for a high-voltage MOSFET that, in order to ensure the reliability for the hot carrier and the breakdown voltage between the source and drain thereof and the semiconductor substrate, the source and drain thereof should be formed deeper with a gradual impurity distribution compared to the source and drain of a core MOSFET. When forming a MONOS (Metal-Oxide-Nitride-Oxide-Silicon) type flash memory over a semiconductor substrate, for example, a power supply voltage of 5 V is often required for the high-voltage MOSFET, for which ensuring the reliability and the breakdown voltage of the high-voltage MOSFET has become an important issue.

Descriptions of a method of forming field effect transistors with different power supply voltages over a same semiconductor substrate are provided in Patent Document 1 (Japanese Patent Laid-Open No. 2006-245167), Patent Document 2 (Japanese Patent Laid-Open No. 2000-243937) and Patent Document 3 (Japanese Patent Laid-Open No. 2007-305711), for example, each of which discloses a manufacturing method of a semiconductor device using a gate-first process of performing heat treatment to activate the semiconductor region for the source and drain after forming the gate electrode.

In addition, there is disclosed in Patent Document 4 (Japanese Patent Laid-Open No. 2007-150321), for example, a manufacturing method of a semiconductor device using a gate-last process of forming a gate electrode after performing heat treatment to activate the semiconductor region for the source and drain.

SUMMARY

In order to reduce the gate length to 20 to 30 nm for a planar core MOSFET, it has become essential to use a high-dielectric (High-k) film having a higher dielectric constant than an oxynitride film as a gate insulating film, and use a conductor film containing, as a main component, metal which can suppress depletion better than polysilicon as the gate electrode. This is mainly because it is necessary to suppress the short channel effect of a MOSFET in order to realize a normal operation for a gate length equal to or less than 30 nm.

However, employing the gate-first process of performing heat treatment to activate the semiconductor region for the source and drain after forming the gate electrode may cause a reaction between the high-k film and the metal film described above, making it difficult to obtain the expected characteristics.

Therefore, when forming a core MOSFET having a gate length of 20 to 30 nm, it is absolutely imperative to use the gate-last process of forming the gate electrode after performing heat treatment to activate the semiconductor region for the source and drain.

Meanwhile, when forming a core MOSFET by the gate-last process, it is natural to form a high-voltage MOSFET over the same semiconductor substrate also by the gate-last process from the viewpoint of avoiding complexity of the process and improving the yield rate.

However, applying the gate-last process to the high-voltage MOSFET along with formation of the core MOSFET gives rise to a problem that the semiconductor region for the source and drain of the high-voltage MOSFET becomes shallow and the impurity distribution becomes steep. This is due to the following reasons.

Due to the short gate length of a core MOSFET, raising the height of the laminated pattern of dummy-gate polysilicon films and hard mask films thereon results in a raised aspect ratio of the laminated pattern, which may cause peeling of the hard mask films or collapsing of the laminated pattern when patterning the laminated pattern, and therefore the laminated pattern cannot be raised very high. Accordingly, the low-height laminated pattern is to be used on the high-voltage side too, and raising the implantation energy of impurity ions in order to deepen the semiconductor region for the source and drain of the high-voltage MOSFET may cause the impurity ions to penetrate through the laminated pattern and reach the channel region due to the thinness of the laminated pattern. In order to avoid this problem, the implantation energy of impurity ions for forming the semiconductor region for the source and drain must be lowered on the high-voltage side, which results in a shallow semiconductor region for the source and drain and a steep impurity distribution.

Here, the following method is also conceivable to form a relatively deep and smooth semiconductor region for the source and drain of a high-voltage MOSFET using the gate-last process. That is, there is a method of, after performing ion implantation to form the source and drain of the high-voltage MOSFET, performing a high temperature annealing of 1000 to 1100° C., for example, to diffuse impurities of the source and drain of the high-voltage MOSFET, and subsequently performing ion implantation to form the source and drain of the core MOSFET.

However, there is a problem with the above method that the high-temperature annealing expands the grain of the dummy-gate polysilicon film, which results in a decreased ability of preventing ion implantation. The core MOSFET, with a short gate length, cannot have the laminated pattern height of dummy-gate polysilicon films and hard mask films thereon made very high due to requirement of the aspect ratio. Accordingly, in the core MOSFET, reduced ability of preventing ion implantation of the dummy gate film due to the grain expansion described above causes impurity ions to penetrate through the laminated pattern and reach the channel region when implanting ions to form the source and drain. As a result, there arises a problem that the short channel characteristics of the core MOSFET is degraded.

Although it is conceivable to use a material other than polysilicon as the dummy gate material, it is appropriate to use polysilicon in consideration of ensuring the etching selection ratio with other parts, since the dummy gates are finally removed in the gate-last process.

The other problems and the new feature will become clear from the description of the present specification and the accompanying drawings.

According to an embodiment, there is provided, when forming, over a semiconductor substrate, a first field effect transistor driven by a first power supply voltage and a second field effect transistor driven by a second power supply voltage higher than the first power supply voltage using a gate-last process, a process of making the thickness of a hard mask film formed over a dummy gate film in the formation region of the second field effect transistor thicker than the thickness of a hard mask film formed over a dummy gate film in the formation region of the first field effect transistor, prior to a process of patterning the dummy gates of the first field effect transistor and the second field effect transistor.

According to an embodiment, even when a semiconductor device having a first field effect transistor driven by a first power supply voltage and a second field effect transistor driven by a second power supply voltage higher than the first power supply voltage provided over a semiconductor substrate is manufactured by the gate-last process, the breakdown voltage of the field effect transistor driven by the relatively higher second supply voltage can be ensured.

DETAILED DESCRIPTION

Figure 1:
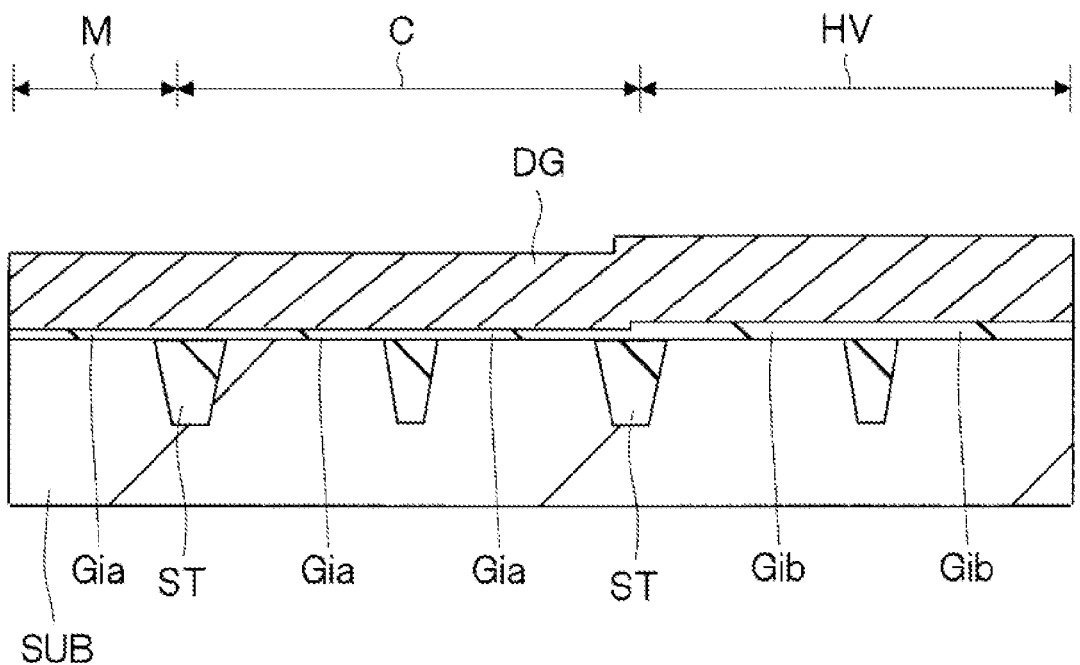
FIG. 1 is a major part cross-sectional view during a process of manufacturing a semiconductor device of an embodiment.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another. In the following embodiments, when referring to the number of elements or the like (including the number, a numeric value, an amount, a range, etc.), they may be not restricted to the specific number but may be greater or smaller than the specific number, except for the case where they are clearly specified in particular and where they are clearly restricted to a specific number theoretically. Furthermore, in the following embodiments, it is needless to say that an element (including an element step and the like) is not necessarily indispensable, except for the case where it is clearly specified in particular and where it is considered to be clearly indispensable from a theoretical point of view and the like. Similarly, in the following embodiments, when shape, position relationship or the like of an element or the like is referred to, what resembles or is similar to the shape substantially shall be included, except for the case where it is clearly specified in particular and where it is considered to be clearly not right from a theoretical point of view. This statement also applies to the numeric value and range described above.

In the following, embodiments will be described in detail, based on the drawings. In all the drawings for explaining embodiments, the same symbol is attached to the member having the same functionality and the repeated explanation thereof is omitted. Additionally, in the following embodiments, explanation of the same or similar part is not repeated, as a principle, unless particularly required.

(First Embodiment)

The semiconductor device of the present first embodiment is, for example, a memory/logic mixed semiconductor device such as an MCU having a nonvolatile memory and a planar Core transistor provided over a same semiconductor substrate.

Mounting a nonvolatile memory besides a volatile memory provides an MCU with very functionally superior characteristics. Among several types of nonvolatile memories, the MONOS flash memory is employed which is suited for miniaturization and highly reliable. In addition, the MONOS flash memory uses a high voltage to perform circuit operation. Therefore, a high-voltage MOSFET is formed in a peripheral circuit such as an input-output circuit of the MONOS flash memory (simply referred to as memory in the following).

In the following, a manufacturing method of the semiconductor device of the present first embodiment will be described, referring to FIGS. 1 to 25. FIGS. 1 to 25 are main part cross-sectional views during the process of manufacturing the semiconductor device of the present first embodiment. Additionally, in the following drawings, the symbol M indicates a memory region, C indicates a core region (a formation region of the first field effect transistor), and HV indicates a high-voltage region (a formation region of the second field effect transistor).

The gate length of a MOSFET (field effect transistor) of the core region C is about 20 to 30 nm, for example. The high-voltage region HV is, for example, a region having formed therein a high-voltage MOSFET which forms a peripheral circuit such as an input-output circuit for the above-mentioned memory, with the power supply voltage (second power supply voltage) of the high-voltage MOSFET being about 5 V, for example, which is higher than the power supply voltage (first power supply voltage) of the MOSFET of the core region C. However, a high-voltage MOSFET having a power supply voltage of 3.3 or 2.5 V, for example, may be provided besides the a high-voltage MOSFET having a power supply voltage of 5 V.

First, as illustrated in FIG. 1, after forming a shallow groove separation unit ST on the main surface of a semiconductor substrate (simply referred to as substrate in the following) SUB including, for example, an n-type or a p-type silicon (Si) single crystal, a gate insulating films (first insulating film) Gia and Gib are formed over the substrate SUB.

The gate insulating films Gia and Gib are formed by silicon oxide ($SiO_2$) or silicon oxynitride (SiON), for example. The gate insulating film Gib of the high-voltage region HV is formed to have a thickness thicker than the thickness of the gate insulating film Gia of the memory region M and the core region C.

Subsequently, a dummy gate film DG is deposited over the main surface of the substrate SUB via the gate insulating films Gia and Gib by CVD (Chemical Vapor Deposition) or the like. The dummy gate film DG is formed of low-resistance polysilicon, for example. The thickness of the dummy gate film DG is about 60 nm, for example.

Figure 2:
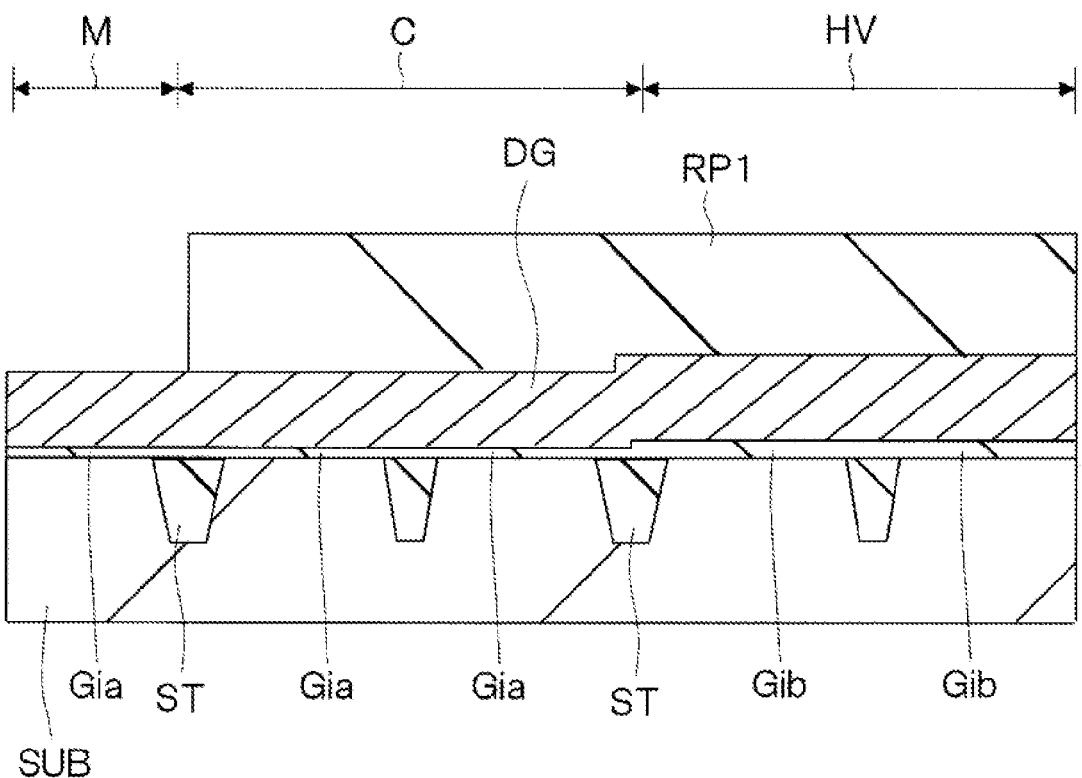
FIG. 2 is a main part cross-sectional view during the process of manufacturing the semiconductor device continuing from FIG. 1.

Thereafter, as illustrated in FIG. 2, a resist pattern RP1 is formed over the dummy gate film DG by lithography. The resist pattern RP1 has been patterned so that the memory region M is exposed and the other regions are covered. Lithography is a series of resist pattern formation processes such as coating, exposure, and developing of the resist film.

Figure 3:
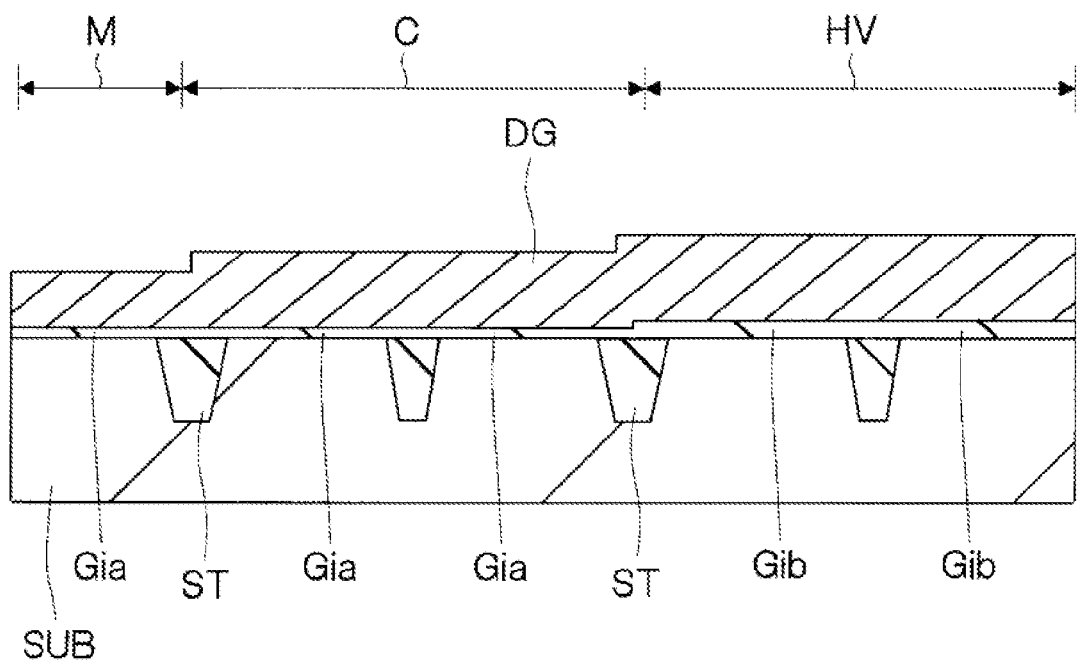
FIG. 3 is a main part cross-sectional view during the process of manufacturing the semiconductor device continuing from FIG. 2.

Thereafter, after removing the upper part of the dummy gate film DG of the memory region M by approximately 20 nm, for example, by performing dry etching using the resist pattern RP1 as an etching mask, the resist pattern RP1 is removed as illustrated in FIG. 3. As a result, the thickness of the dummy gate film DG of the memory region M becomes thinner than the thickness of the dummy gate film DG of the core region C and the high-voltage region HV.

Figure 4:
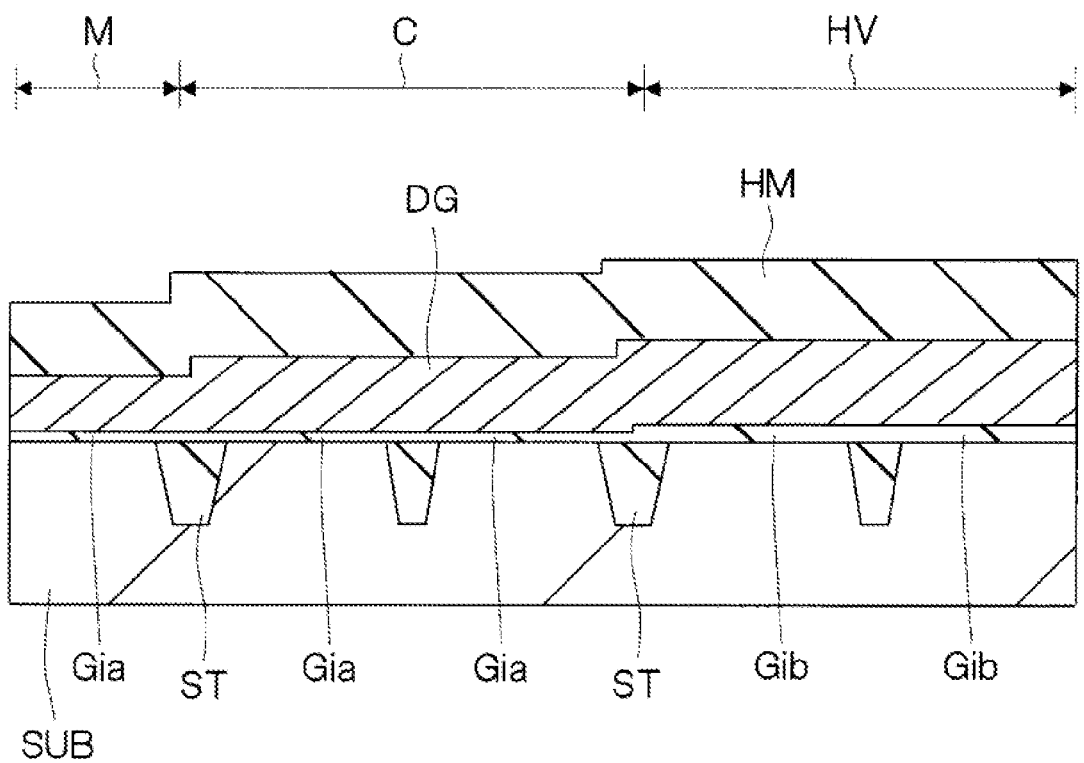
FIG. 4 is a main part cross-sectional view during the process of manufacturing the semiconductor device continuing from FIG. 3.

Subsequently, as illustrated in FIG. 4, the hard mask film HM is deposited over the dummy gate film DG by CVD or the like. The hard mask film HM is formed of silicon nitride ($Si_3N_4$), for example. Forming the hard mask film HM with silicon nitride provides a high ability to prevent implantation of impurities. The thickness of the hard mask film HM is about 100 nm, for example.

Figure 5:
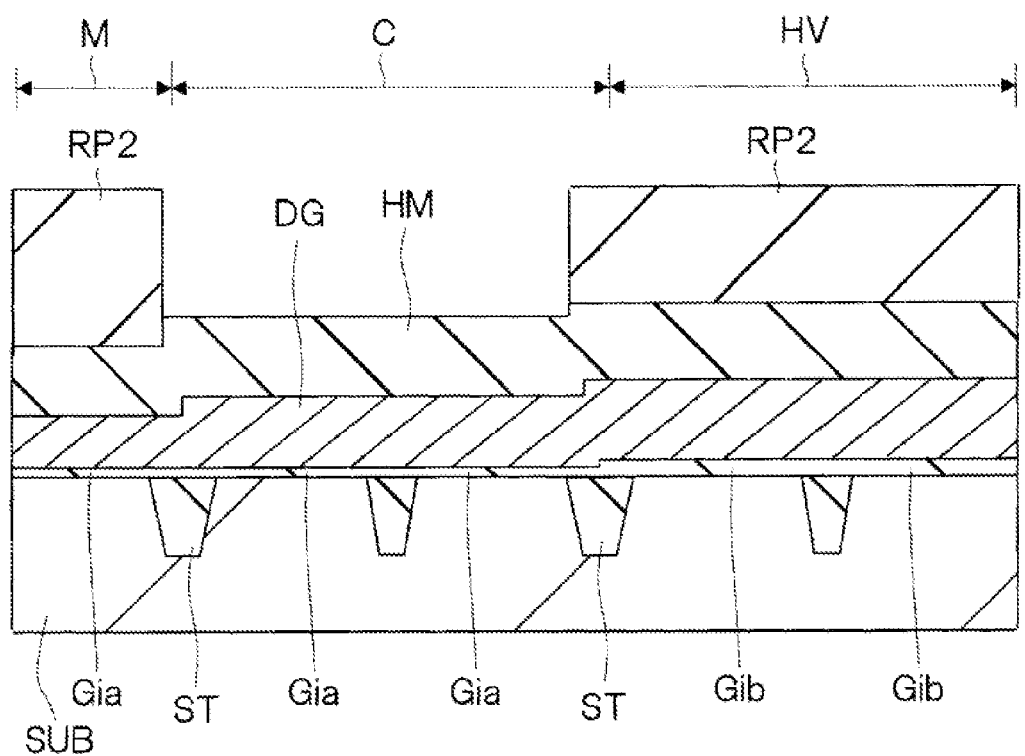
FIG. 5 is a main part cross-sectional view during the process of manufacturing the semiconductor device continuing from FIG. 4.

Subsequently, as illustrated in FIG. 5, a resist pattern RP2 is formed over the hard mask film HM by lithography. The resist pattern RP2 has been patterned so that the core region C is exposed and the other regions are covered.

Figure 6:
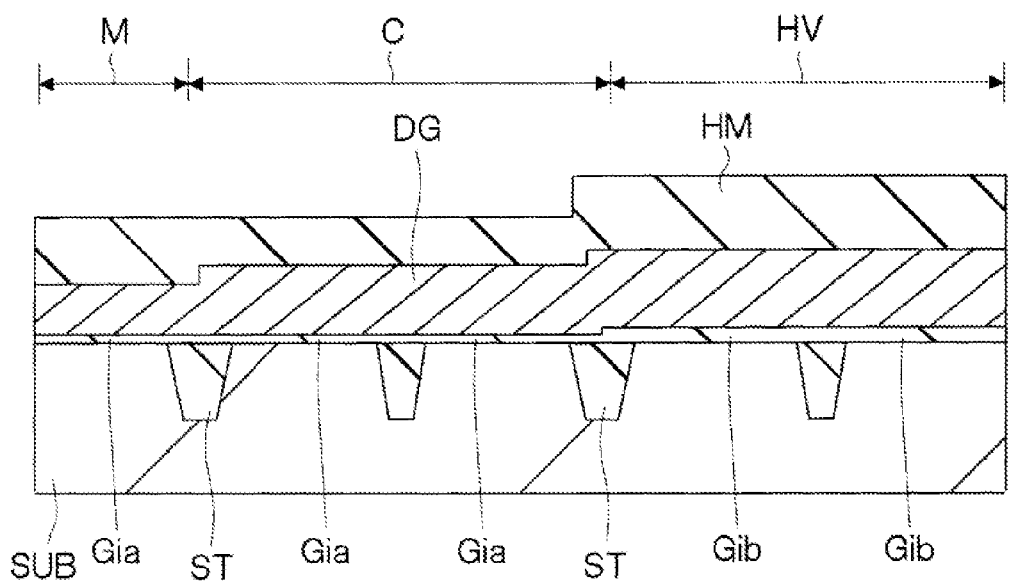
FIG. 6 is a main part cross-sectional view during the process of manufacturing the semiconductor device continuing from FIG. 5.

Thereafter, after removing the upper part of the hard mask film HM of the core region C by about 80 nm, for example, by performing dry etching using the resist pattern RP2 as the etching mask, the resist pattern RP2 is removed as illustrated in FIG. 6. As a result, the thickness of the hard mask film HM of the high-voltage region HV becomes thicker than the thickness of the hard mask film HM of the core region C. The thickness of the hard mask film HM of the high-voltage region HV at this stage is about 100 nm, for example, and the thickness of the hard mask film HM of the core region C is about 20 to 30 nm, for example.

In addition, the above-mentioned dry etching is performed so that the upper surface height of the hard mask film HM becomes approximately the same for the core region C and the memory region M. However, although the upper surface height of the hard mask film HM is approximately the same for the memory region M and the core region C, the thickness of the hard mask film HM of the memory region M has become thicker than the thickness of the hard mask film HM of the core region C by the amount that the upper part of the dummy gate film DG of the memory region M has been removed as described above.

Figure 7:
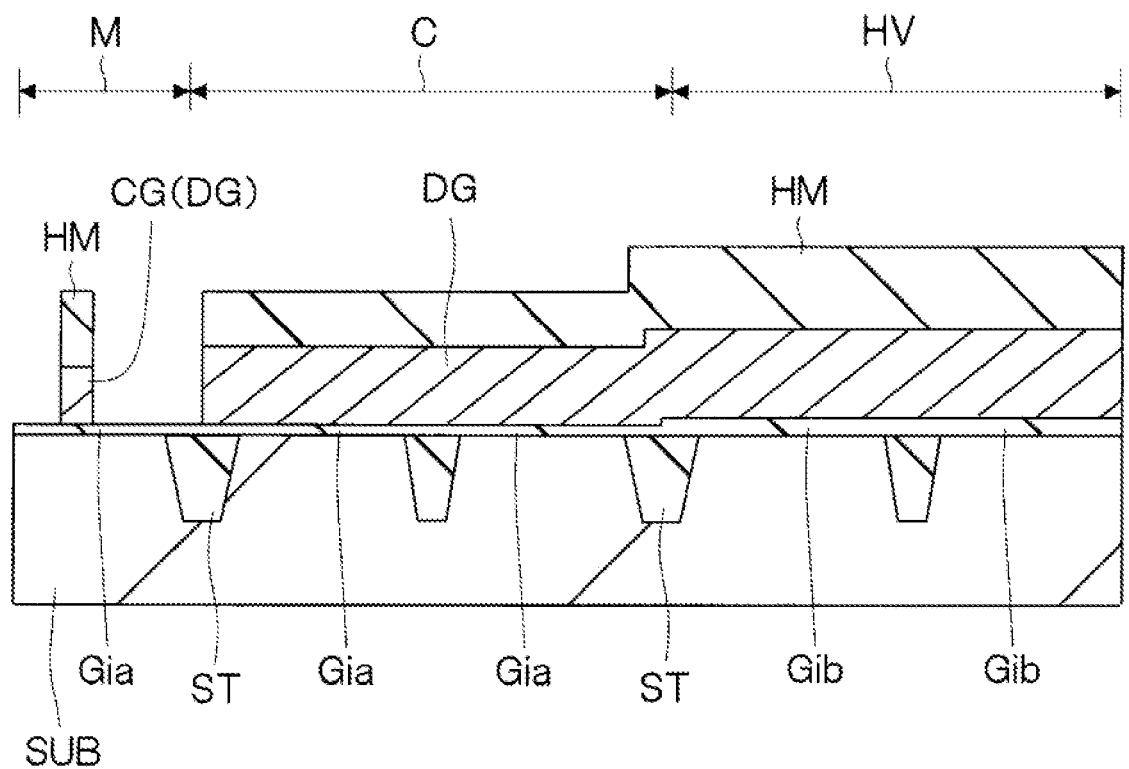
FIG. 7 is a main part cross-sectional view during the process of manufacturing the semiconductor device continuing from FIG. 6.

Subsequently, as illustrated in FIG. 7, a control gate CG, which has been formed of the dummy gate film DG, is formed in the memory region M, by patterning the dummy gate film DG and the hard mask film HM by lithography and dry etching.

Figure 8:
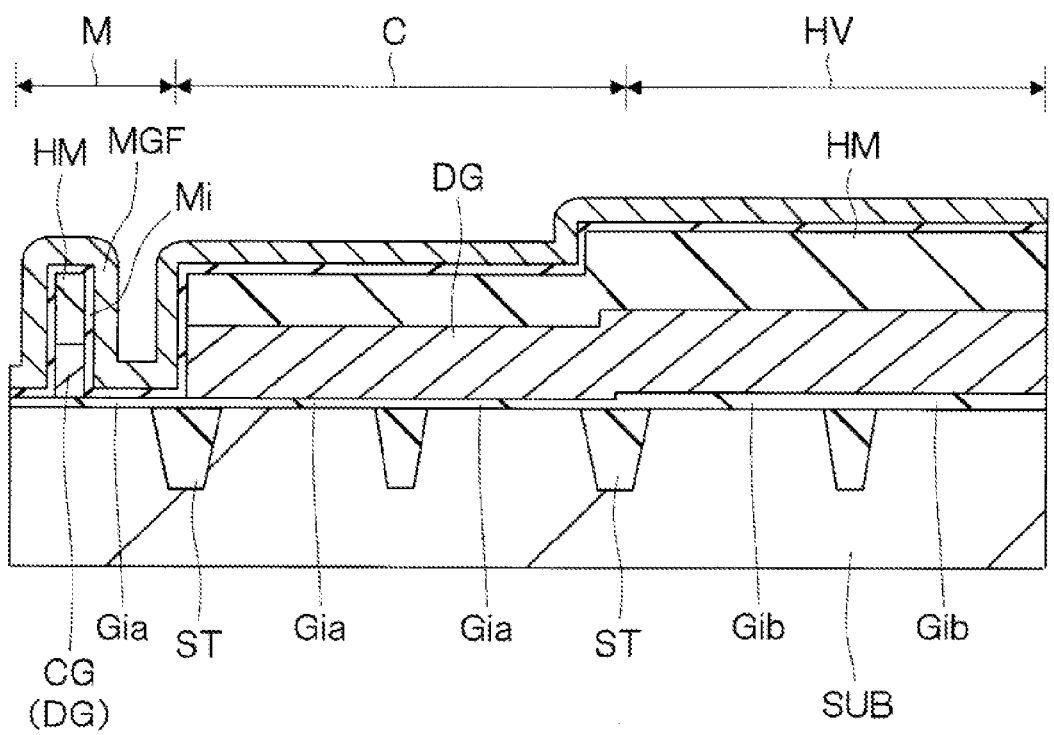
FIG. 8 is a main part cross-sectional view during the process of manufacturing the semiconductor device continuing from FIG. 7.

Subsequently, as illustrated in FIG. 8, a memory insulating film Mi and a memory gate film MGF are deposited over the substrate SUB by CVD or the like sequentially from the bottom layer. The memory insulating film Mi is formed by sequentially laminating, for example, a silicon oxide film, a silicon nitride film and a silicon oxide film from the bottom layer. The memory gate film MGF is formed of low-resistance polysilicon, for example.

Figure 9:
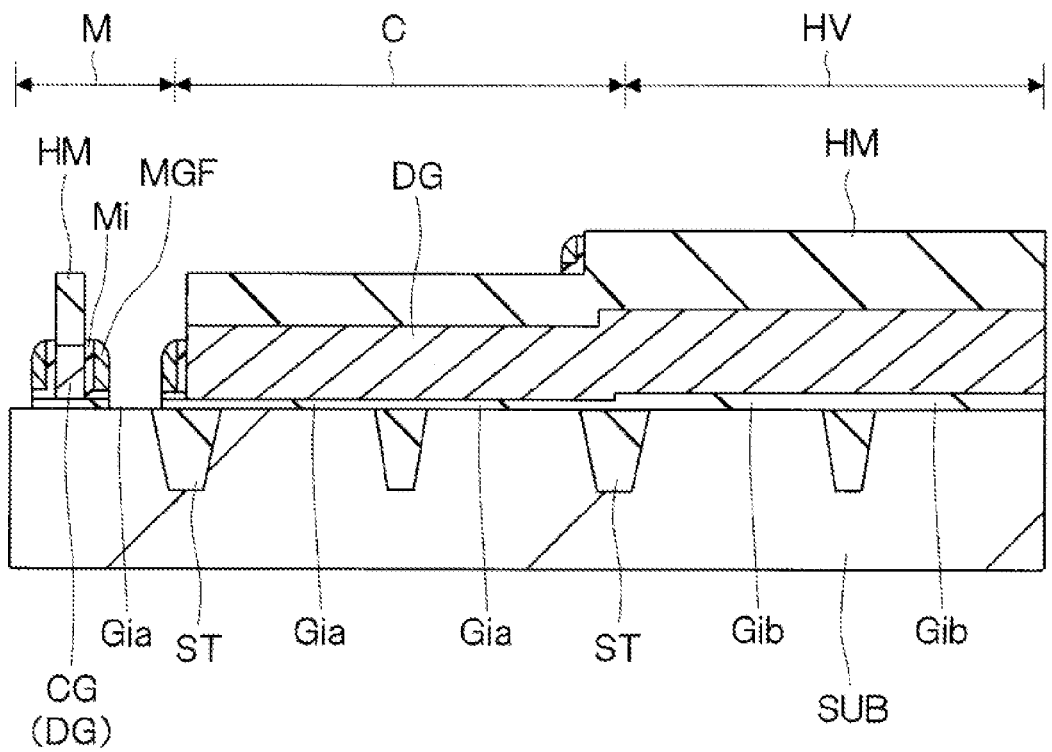
FIG. 9 is a main part cross-sectional view during the process of manufacturing the semiconductor device continuing from FIG. 8.

Thereafter, the memory gate film MGF and the memory insulating film Mi are etched back by anisotropic dry etching. As a result, the memory insulating film Mi and the memory gate film MGF are left on both lateral sides of the pattern of the control gate CG and the hard mask film HM thereon, as illustrated in FIG. 9.

Figure 10:
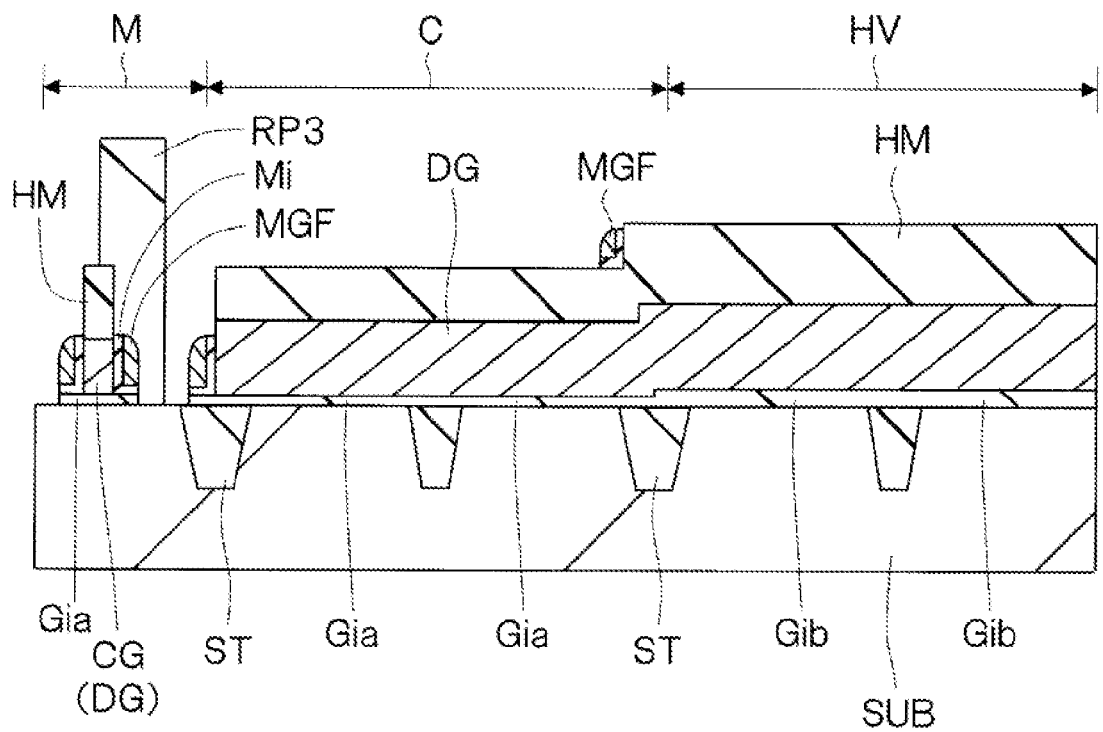
FIG. 10 is a main part cross-sectional view during the process of manufacturing the semiconductor device continuing from FIG. 9.

Subsequently, as illustrated in FIG. 10, a resist pattern RP3 is formed over the substrate SUB by lithography. The resist pattern RP3 is formed so that a part of the memory gate formation region is covered and the other regions are exposed.

Figure 11:
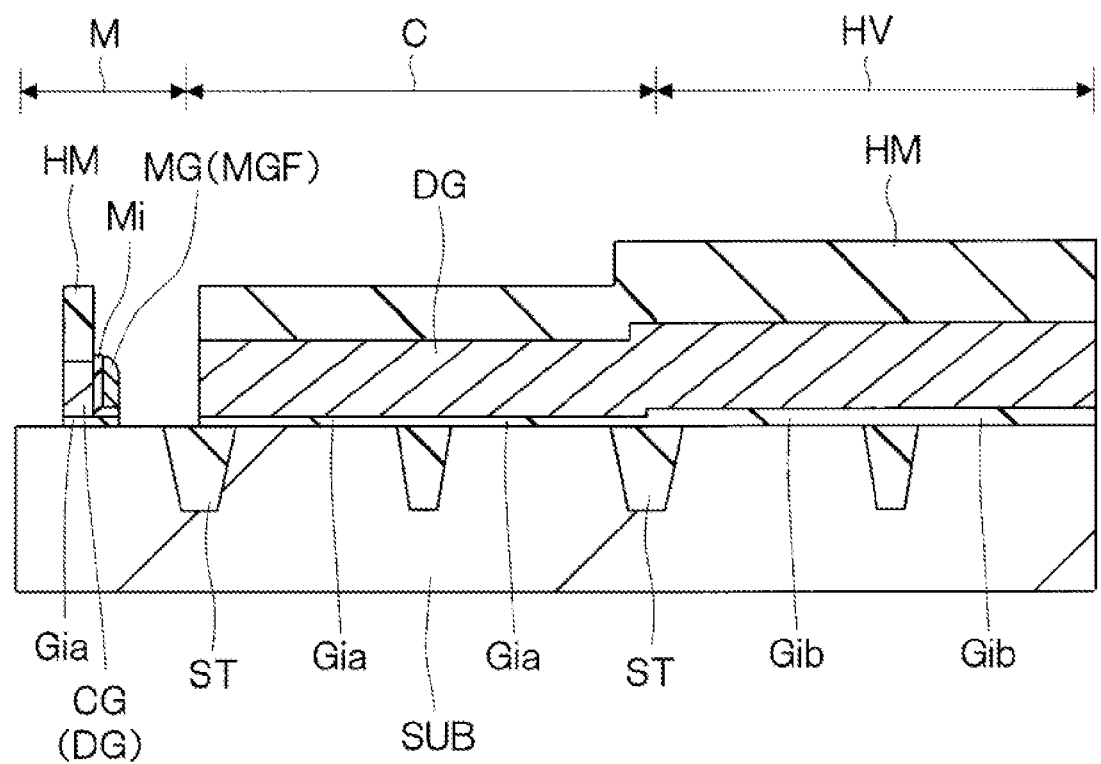
FIG. 11 is a main part cross-sectional view during the process of manufacturing the semiconductor device continuing from FIG. 10.

Subsequently, using the resist pattern RP3 as the etching mask, the memory gate film MGF and the memory insulating film Mi exposed therefrom are removed. Accordingly, the memory gate MG, which is formed of the memory gate film MGF, is formed on one lateral side of the control gate CG via the memory insulating film Mi, as illustrated in FIG. 11.

Figure 12:
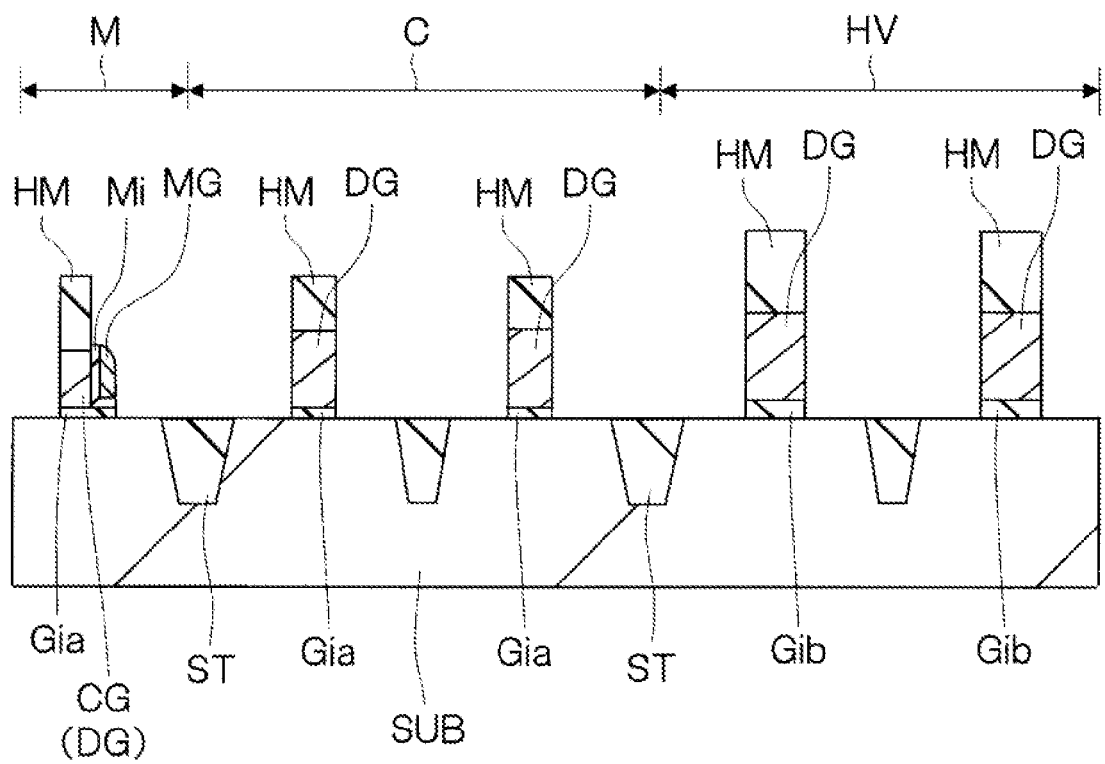
FIG. 12 is a main part cross-sectional view during the process of manufacturing the semiconductor device continuing from FIG. 11.

Thereafter, as illustrated in FIG. 12, the dummy gate film DG and the hard mask film HM of the core region C and the high-voltage region HV are patterned by being subjected to lithography, dry etching, wet etching, or the like. Accordingly, a pattern which is formed of the dummy gate film DG and the hard mask film HM thereon is provided in the core region C and the high-voltage region HV.

The width (length in the short direction: gate length) of the dummy gate film DG of the core region C at this stage is 20 to 30 nm, for example, and its thickness is 60 nm, for example. In addition, the thickness of the hard mask film HM over the dummy gate film DG of the core region C is about 20 to 30 nm.

On the other hand, the width (length in the short direction: gate length) of the dummy gate film DG of the high-voltage region HV is 0.5 to 0.6 μm, for example, and its thickness is 60 nm, for example. In addition, the thickness of the hard mask film HM over the dummy gate film DG of the high-voltage region HV is about 100 nm.

Here, since the width of the dummy gate film DG of the core region C is extremely thin, there arises a problem, if the hard mask film HM thereon is too thick, that the hard mask film HM may peel at patterning in the core region C, or the pattern formed over the dummy gate film DG and the hard mask film HM may collapse. With the present first embodiment, in contrast, since the hard mask film HM of the core region C has been made thin as described above (see FIG. 6), peeling of the hard mask film HM in the core region C or collapse of the pattern formed in the dummy gate film DG and the hard mask film HM thereon can be prevented. As a result, the reliability and yield of the semiconductor device can be improved.

When the etching process is performed to form the above-mentioned pattern in the core region C and the high-voltage region HV, the memory region M is covered with the resist pattern.

Figure 13:
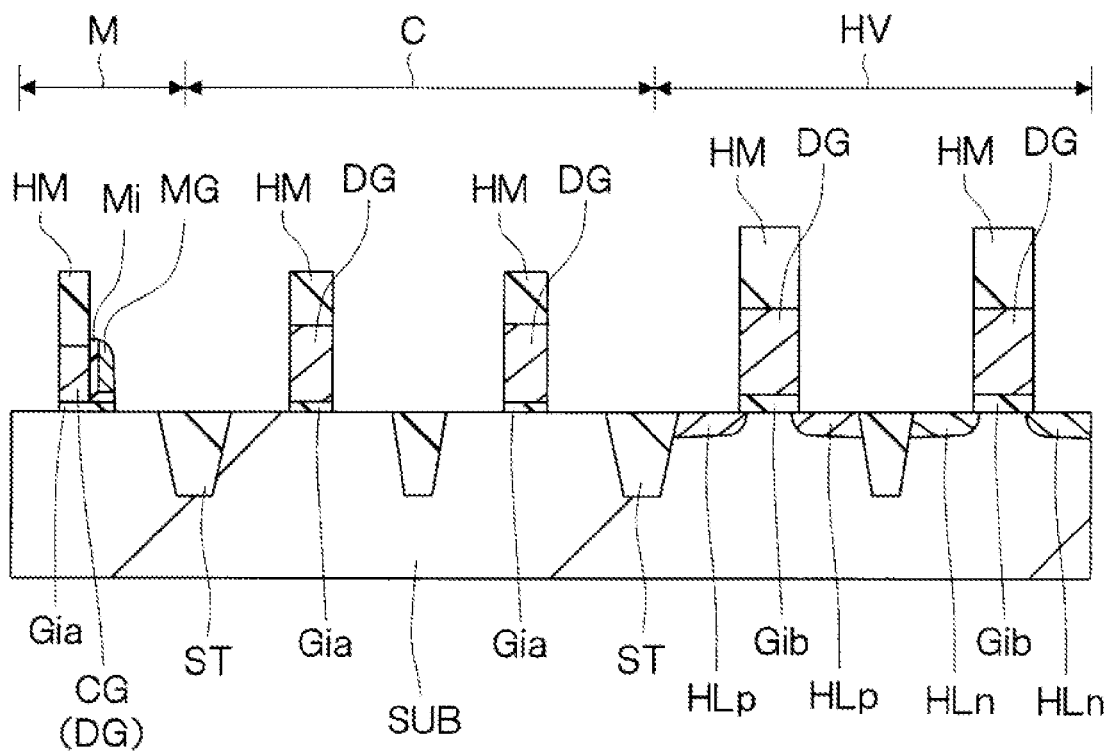
FIG. 13 is a main part cross-sectional view during the process of manufacturing the semiconductor device continuing from FIG. 12.

Subsequently, as illustrated in FIG. 13, a $p^-$-type semiconductor region HLp and an $n^-$-type semiconductor region HLn having a low impurity concentration to be used for an LDD (Lightly Doped Drain) for forming the source and drain in the high-voltage region HV are formed by ion implantation.

Here, since the hard mask film HM of the high-voltage region HV is made thick in the present embodiment, the ion implantation energy when forming the low-impurity-concentration semiconductor regions HLp and HLn for the LDD of the high-voltage region HV can be raised higher than the ion implantation energy when forming the low-impurity-concentration semiconductor region for the LDD of the core region C. Accordingly, the low-impurity-concentration semiconductor regions HLp and HLn for the LDD of the high-voltage region HV can be formed with a deeper depth and a smoother impurity distribution than the low-impurity-concentration semiconductor region for the LDD of the core region C.

The p⁻-type semiconductor region HLp of the high-voltage region HV has boron (B), for example, introduced therein, and the n⁻-type semiconductor region HLn has phosphorus (P) or arsenic (As), for example, introduced therein. Additionally, during the process of ion implantation into the semiconductor regions HLp and HLn, the memory region M and the core region C are covered with the resist pattern. In addition, respective ion implantations into the semiconductor regions HLp and HLn are performed separately, with one of the regions being covered with the resist pattern during the ion implantation into the other.

Figure 14:
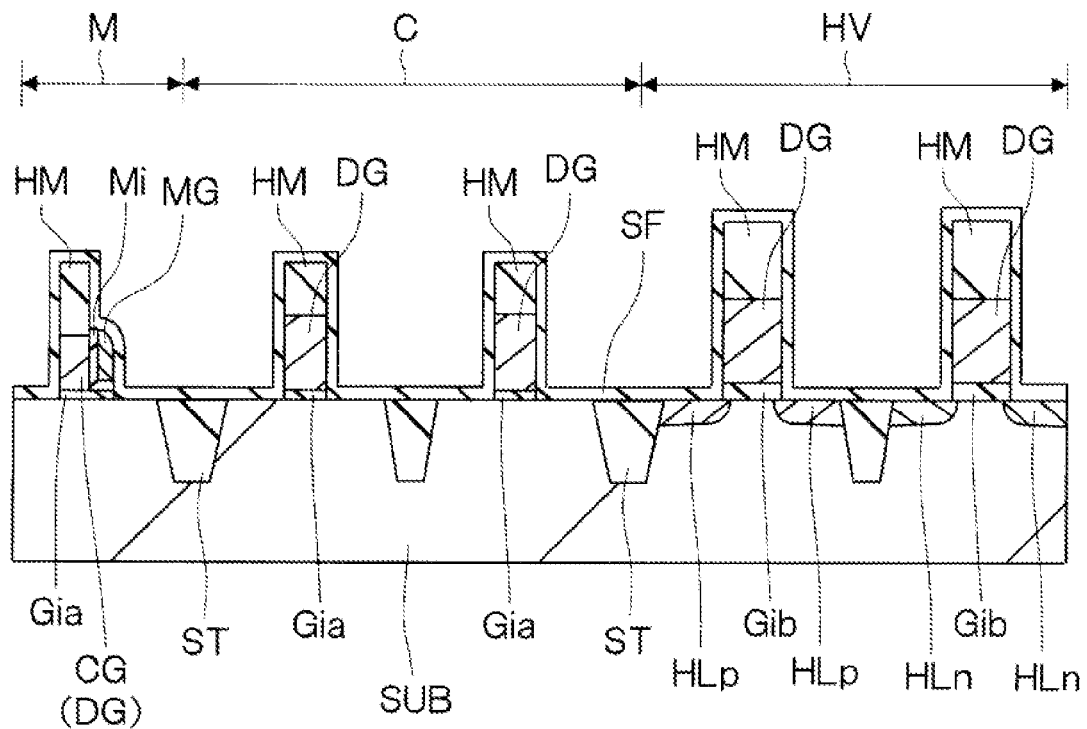
FIG. 14 is a main part cross-sectional view during the process of manufacturing the semiconductor device continuing from FIG. 13.

Subsequently, as illustrated in FIG. 14, a spacer film SF for offset is formed by CVD or ALD (Atomic Layer Deposition) as a part of forming the low-impurity-concentration semiconductor region for the LDD of the core region C. The spacer film SF, being formed of silicon oxide, for example, is formed so as to cover the pattern of the dummy gate film DG and the hard mask film HM, and the surface of the control gate CG, the hard mask film HM thereon and the memory gate MG.

Figure 15:
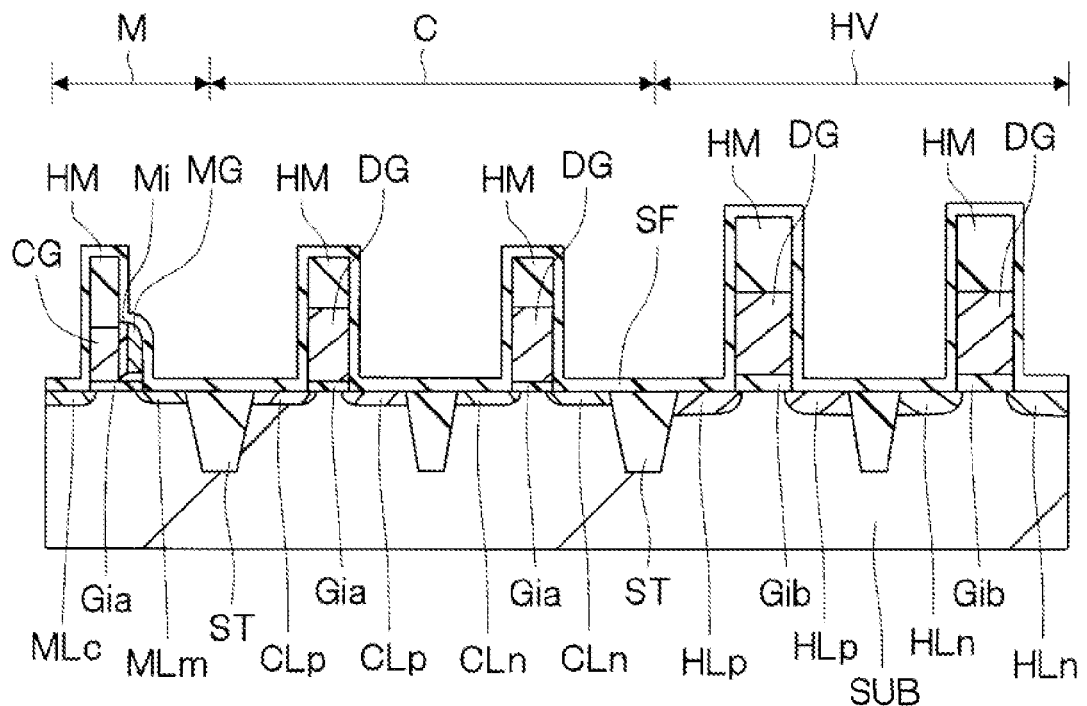
FIG. 15 is a main part cross-sectional view during the process of manufacturing the semiconductor device continuing from FIG. 14.

Thereafter, as illustrated in FIG. 15, a p⁻-type semiconductor region CLp and an n⁻-type semiconductor region CLn having a low impurity concentration to be used for an LDD for forming the source and drain in the core region C are formed by ion implantation. In addition, n⁻-type semiconductor regions MLm and MLc having a low impurity concentration are formed in the memory region M by ion implantation.

The p⁻-type semiconductor region CLp has B, for example, introduced therein, and the n⁻-type semiconductor regions CLn, MLm and MLc have P or As, for example, introduced therein. During the process of ion implantation into the semiconductor regions CLp and CLn of the core region C, the memory region M and the high-voltage region HV are covered with the resist pattern. In addition, respective ion implantations into the semiconductor regions CLp and CLn are performed separately, with one of the regions being covered with the resist pattern during the ion implantation into the other.

In addition, during the process of ion implantation into the semiconductor regions MLm and MLc of the memory region M, the core region C and the high-voltage region HV are covered with the resist pattern. In addition, respective ion implantations into the semiconductor regions MLm and MLc are performed separately, with one of the regions being covered with the resist pattern during the ion implantation into the other.

Figure 16:
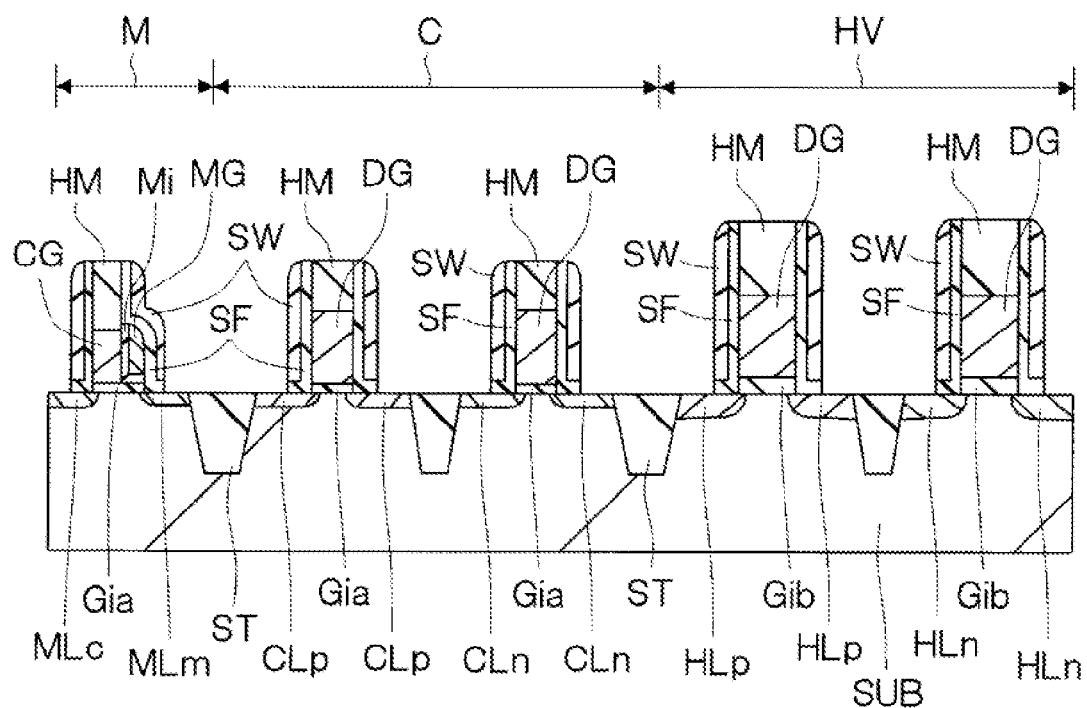
FIG. 16 is a main part cross-sectional view during the process of manufacturing the semiconductor device continuing from FIG. 15.

Subsequently, by depositing an insulating film over the substrate SUB by CVD or the like and thereafter etching it back by anisotropic dry etching, a side wall SW is formed, as illustrated in FIG. 16. Although the side wall SW is formed of silicon nitride, for example, this is not limiting and may be varied in a number of ways; for example, it may be formed of a laminated film of a nitride film and an oxide film.

Figure 17:
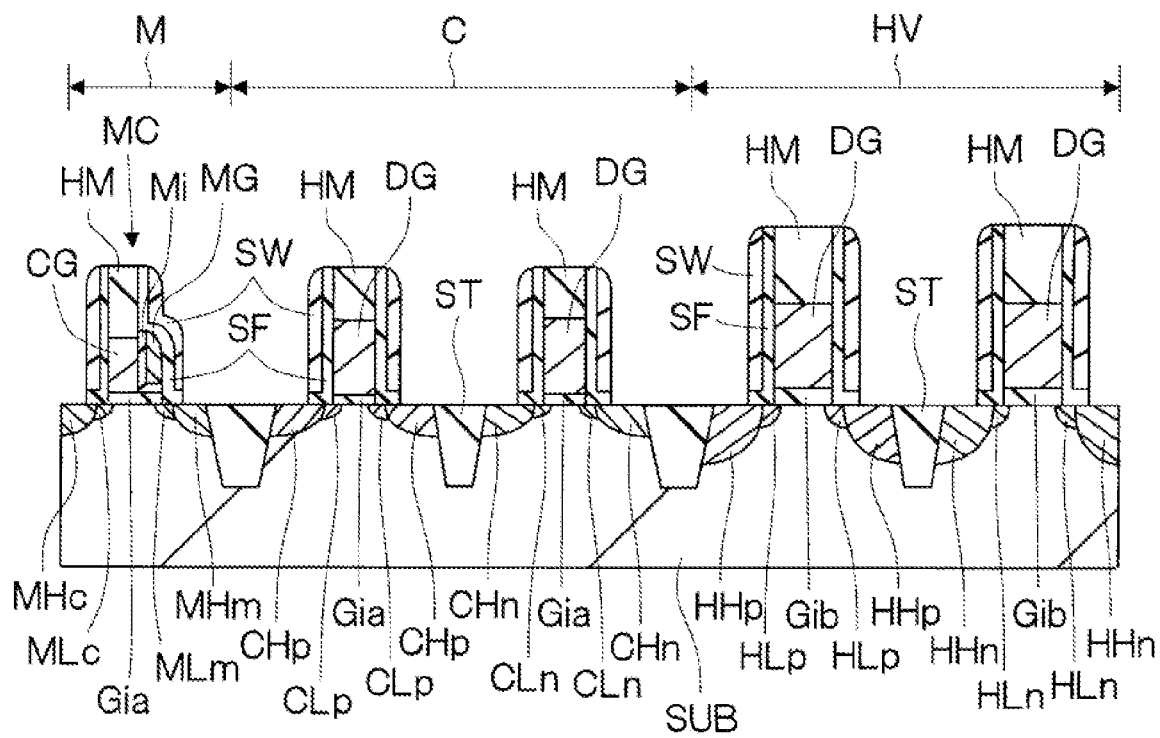
FIG. 17 is a main part cross-sectional view during the process of manufacturing the semiconductor device continuing from FIG. 16.

Subsequently, as illustrated in FIG. 17, a high-impurity-concentration p⁺-type semiconductor region HHp and n⁺-type semiconductor region HHn for the source and drain are formed in the high-voltage region HV by ion implantation. In addition, a high-impurity-concentration p⁺-type semiconductor region CHp and n⁺-type semiconductor region CHn for the source and drain are formed in the core region C by ion implantation. In addition, high-impurity-concentration n⁺-type semiconductor regions MHm and MHc are formed in the memory region M by ion implantation, and a split-gate memory cell (nonvolatile memory cell) MC is formed in which the control gate CG and the memory gate MG are arranged in alignment along the upper surface of the substrate SUB via the memory insulating film Mi.

Here, since the hard mask film HM of the high-voltage region HV is made thick in the present embodiment, the ion implantation energy when forming the high-impurity-concentration semiconductor regions HHp and HHn in the high-voltage region HV can be raised higher than the ion implantation energy when forming the high-impurity-concentration semiconductor regions CHp and CHn of the core region C. Accordingly, the high-impurity-concentration semiconductor regions HHp and HHn of the high-voltage region HV can be formed with a deeper depth and a smoother impurity distribution than the high-impurity-concentration semiconductor regions CHp and CHn of the core region C.

The p⁺-type semiconductor regions HHp and CHp have B introduced therein, for example, and the n⁺-type semiconductor regions HHn, CHn, MHm and MHc have P or As introduced therein, for example.

During the process of ion implantation into the semiconductor regions HHp and HHn of the high-voltage region HV, the memory region M and the core region C are covered with the resist pattern. In addition, respective ion implantations into the semiconductor regions HHp and HHn are performed separately, with one of the regions being covered with the resist pattern during the ion implantation into the other.

In addition, during the process of ion implantation into the semiconductor regions CHp and CHn of the core region C, the memory region M and the high-voltage region HV are covered with the resist pattern. In addition, respective ion implantations into the semiconductor regions CHp and CHn are performed separately, with one of the regions being covered with the resist pattern during the ion implantation into the other.

In addition, during the process of ion implantation into the semiconductor regions MHm and MHc of the memory region M, the core region C and the high-voltage region HV are covered with the resist pattern. In addition, respective ion implantations into the semiconductor regions MHm and MHc are performed separately, with one of the regions being with the resist pattern during the ion implantation into the other.

Thereafter, a high-temperature and short-time annealing such as spike RTA (Rapid Thermal Annealing), for example, is performed over the substrate SUB. As a result, impurities in the semiconductor regions HLp, HHp, HLn, HHn, CLp, CHp, CLn, CHn, MLm, MHm, MLc and MHc formed over the substrate SUB are activated. The achieved temperature in the annealing is 1000° C., for example, and the processing time is several tens of milliseconds, for example.

Figure 18:
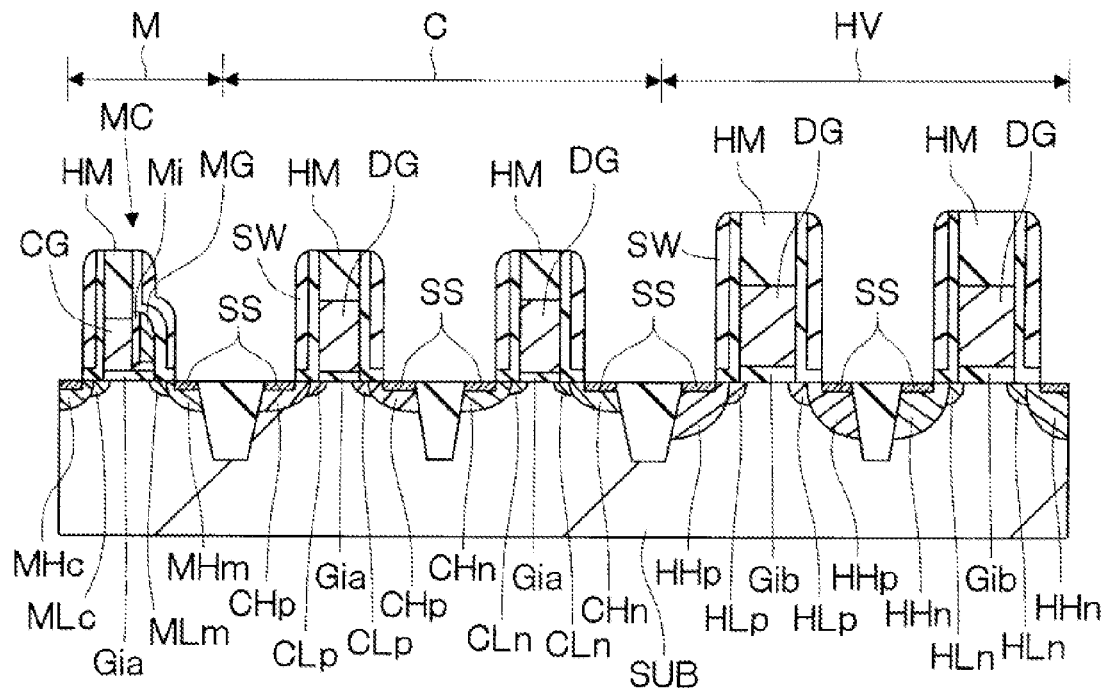
FIG. 18 is a main part cross-sectional view during the process of manufacturing the semiconductor device continuing from FIG. 17.

Subsequently, as illustrated in FIG. 18, a silicide SS is formed over the substrate SUB. The silicide SS is formed of nickel silicide or nickel platinum silicide, for example. Since such materials can be formed at a low temperature of about 300° C., for example, the silicide SS can be formed without causing thermal diffusion of the low-impurity-concentration semiconductor regions CLp and CLn of the core region C.

Figure 19:
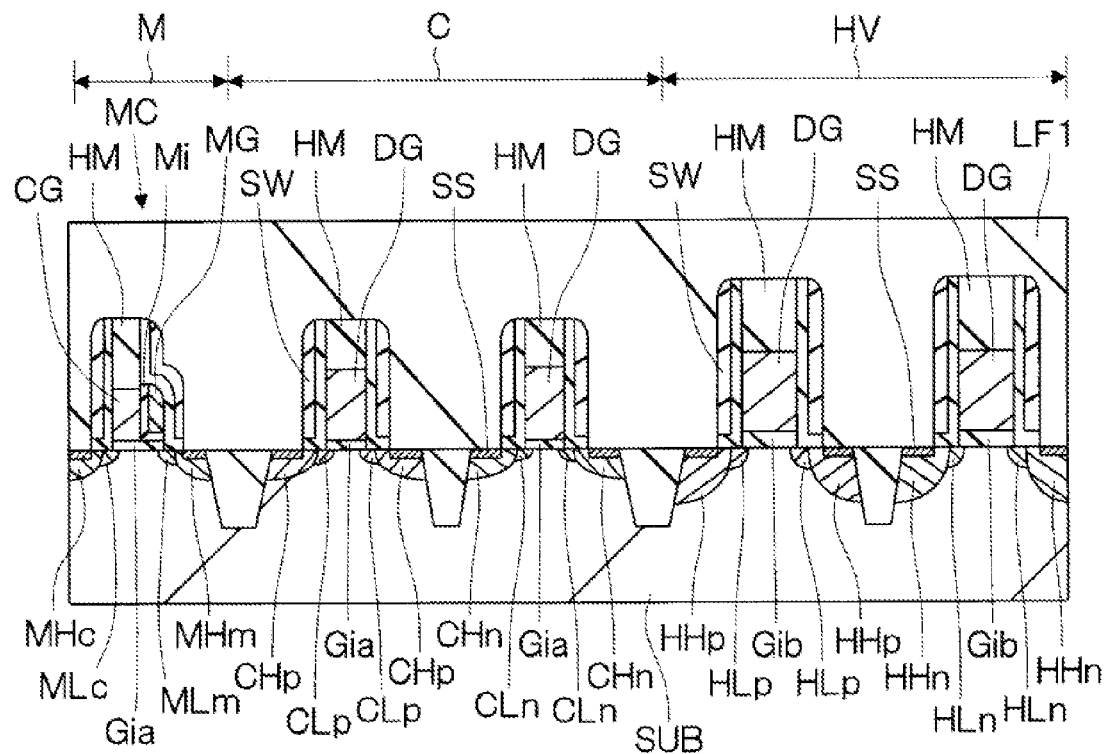
FIG. 19 is a main part cross-sectional view during the process of manufacturing the semiconductor device continuing from FIG. 18.

Subsequently, as illustrated in FIG. 19, an insulating film (second insulating film) LF1 is deposited over the substrate SUB by CVD using ozone ($O_3$) and TEOS (Tetra Ethyl Ortho Silicate), for example, as the material gas. The insulating film LF1 is formed of silicon oxide, for example.

Figure 20:
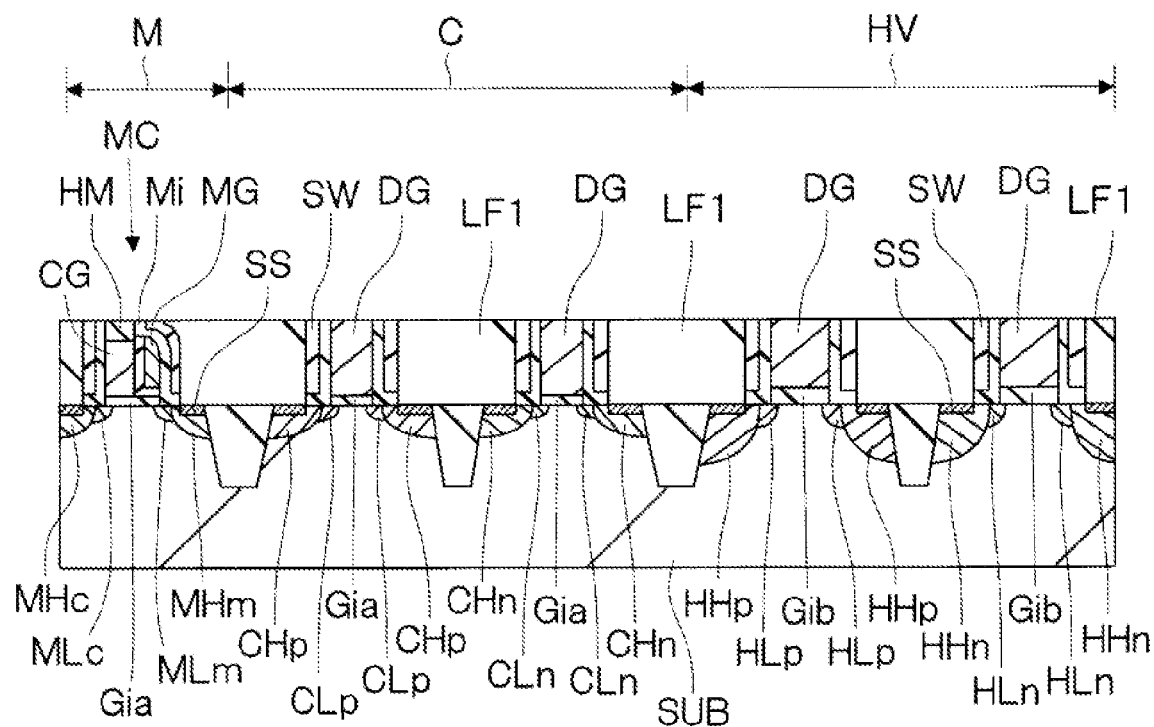
FIG. 20 is a main part cross-sectional view during the process of manufacturing the semiconductor device continuing from FIG. 19.

Thereafter, as illustrated in FIG. 20, the upper part of the insulating film LF1 is removed by CMP (Chemical Mechanical Polishing) until the upper surface of the dummy gate film DG of the core region C and the high-voltage region HV is exposed. In addition, with CMP, since the hard mask film HM of the memory region M is formed to have a thickness thicker than other regions, the hard mask film HM is left over the control gate CG.

Figure 21:
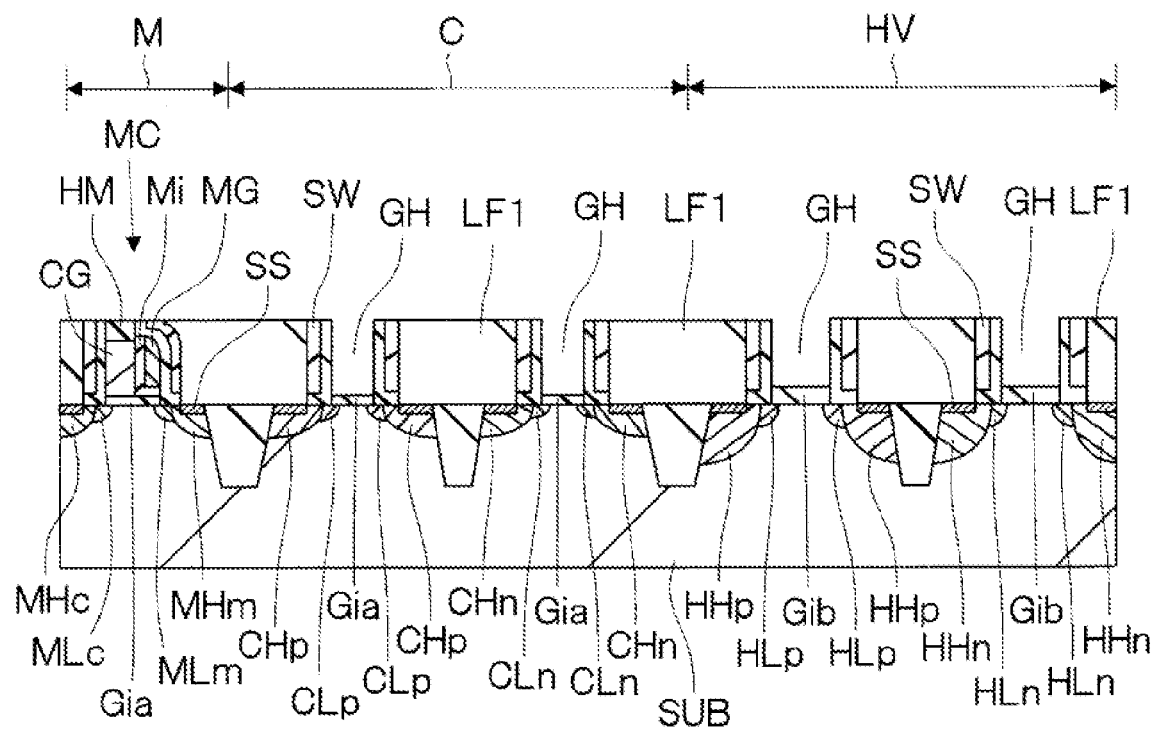
FIG. 21 is a main part cross-sectional view during the process of manufacturing the semiconductor device continuing from FIG. 20.

Thereafter, the dummy gate film DG of the core region C and the high-voltage region HV is removed, as illustrated in FIG. 21 by wet etching using a solution such as ammonia water. As a result, a recess GH opened by removing the dummy gate film DG is formed in the insulating film LF1 of the core region C and the high-voltage region HV. Since the memory region M has the hard mask film HM left over the dummy gate film DG, the control gate CG formed of the dummy gate film DG also remains.

Figure 22:
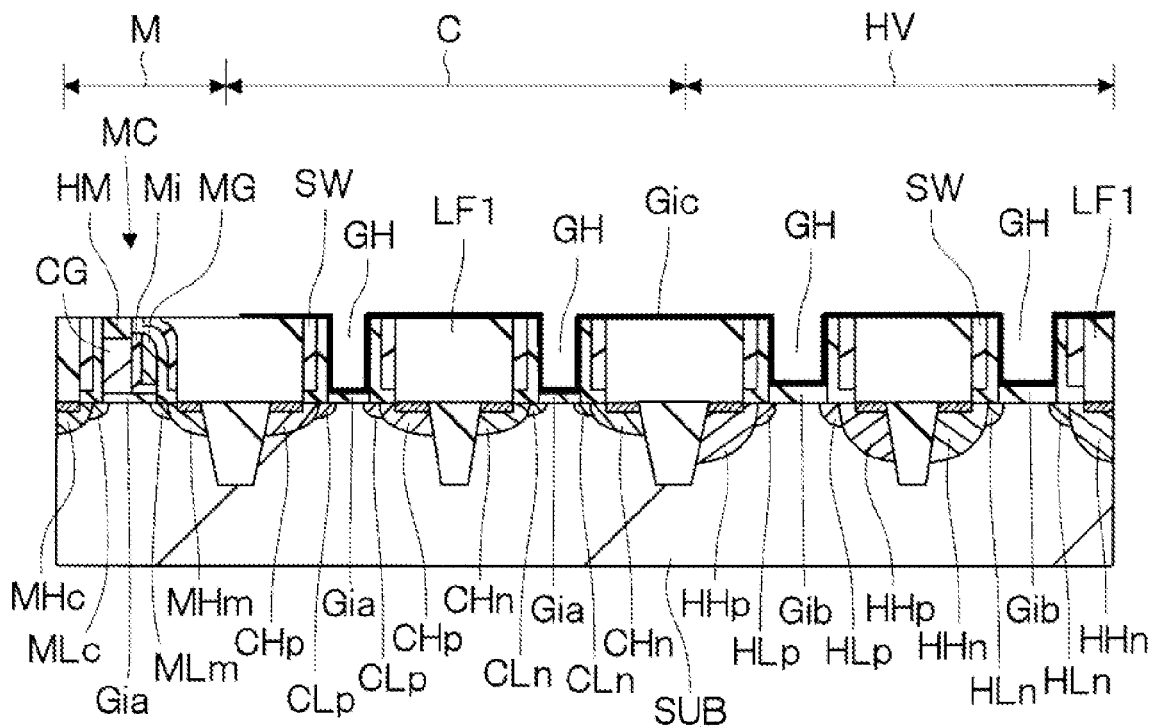
FIG. 22 is a main part cross-sectional view during the process of manufacturing the semiconductor device continuing from FIG. 21.

Subsequently, as illustrated in FIG. 22, a high-k gate insulating film (third insulating film) Gic is deposited over the substrate SUB by CVD or the like. The gate insulating film Gic is formed of an insulating film such as, for example, hafnium oxide ($HfO_2$) having a higher dielectric constant than silicon oxide, and adhered in the recess GH of the core region C and the high-voltage region HV.

Although it is notably the core region C that requires the high-k gate insulating film Gic, the high-k gate insulating film Gic may also be required by the high-voltage region HV depending on the design. Therefore, patterning of the gate insulating film Gic is performed by lithography and etching after the gate insulating film Gic has been deposited.

Figure 23:
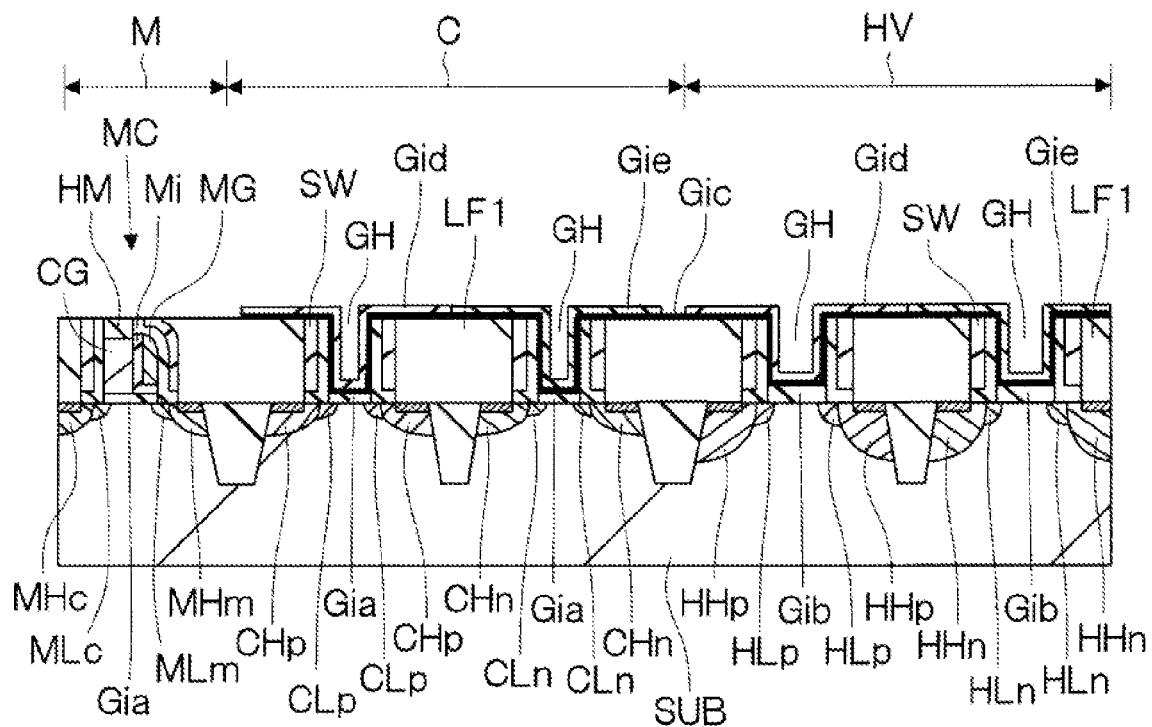
FIG. 23 is a main part cross-sectional view during the process of manufacturing the semiconductor device continuing from FIG. 22.

Subsequently, as illustrated in FIG. 23, high-k gate insulating films (third insulating film) Gid and Gie other than that of $HfO_2$ described above are formed in the formation region of a p-channel and an n-channel MOSFET, in order to optimally set a threshold value of the p-channel and n-channel MOSFETs of the core region C and the high-voltage region HV. The gate insulating films Gid and Gie are adhered in the recess GH of the core region C and the high-voltage region HV.

The gate insulating film Gid of the p-channel MOSFET is formed of aluminum oxide ($Al_2O_3$), for example. On the other hand, the gate insulating film Gie of the n-channel MOSFET is formed of lantern oxide ($La_2O_3$) or yttrium oxide ($Y_2O_3$), for example.

Figure 24:
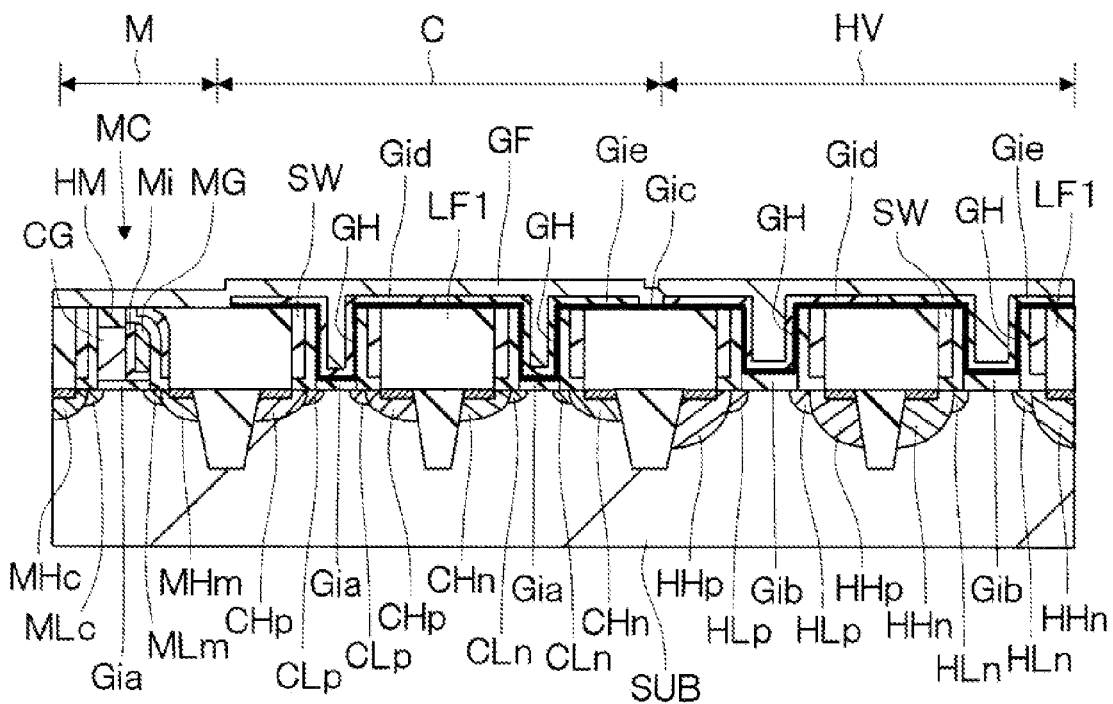
FIG. 24 is a main part cross-sectional view during the process of manufacturing the semiconductor device continuing from FIG. 23.

Thereafter, as illustrated in FIG. 24, a gate film GF for work function adjustment is deposited over the substrate SUB by sputtering or CVD, in order to optimally set the threshold value of the p-channel and the n-channel MOSFETs of the core region C and the high-voltage region HV.

The gate film GF, formed of a conductor film containing metal as a main component such as, for example, titanium nitride (TiN), is buried in the recess GH of the core region C and the high-voltage region HV.

Although the gate film GF may be the same for the p-channel MOSFET and the n-channel MOSFET, it may be different. For example, TiN may be used as the gate film GF of the p-channel MOSFET and tantalum nitride (TaN), aluminum (Al) or the like may be used as the gate film GF of the n-channel MOSFET.

As thus described, the threshold value of each MOSFET is adjusted by appropriately setting the gate film GF, the gate insulating films Gia to Gie, and channel implantation.

Figure 25:
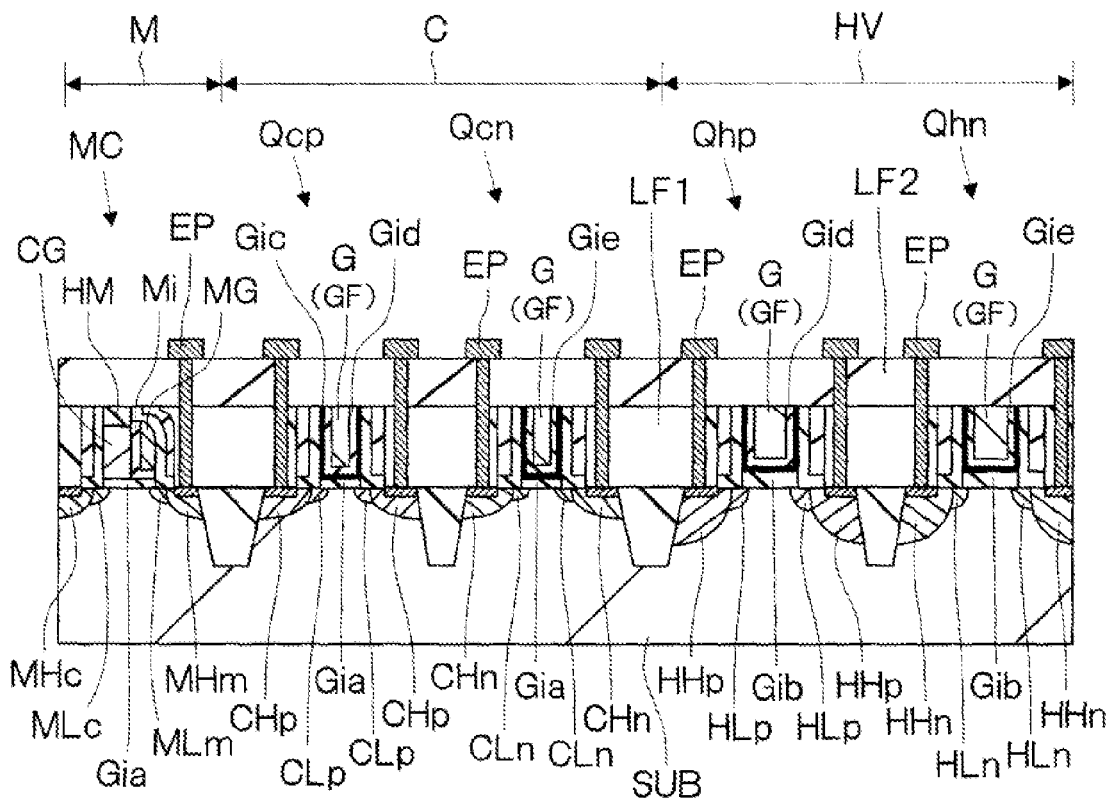
FIG. 25 is a main part cross-sectional view during the process of manufacturing the semiconductor device continuing from FIG. 24.

Subsequently, as illustrated in FIG. 25, the gate film GF is removed by CMP or the like, and in the recess GH of the core region C and the high-voltage region HV, a gate electrode G formed of the gate film GF is formed. Accordingly, p-channel and n-channel MOSFETs (first field effect transistors) Qcp and Qcn are formed in the core region C, and p-channel and n-channel MOSFETs (second field effect transistors) Qhp and Qhn having a high breakdown voltage are formed in the high-voltage region HV. With regard to the substrate SUB, a well having a conductivity reverse to that of the substrate SUB has been formed in a region where the conductivity of the substrate SUB and the conductivity of the channel of the MOSFET are the same, and the channel of the MOSFET and the substrate SUB are electrically isolated, with the well omitted in the drawing for the sake of convenience.

Subsequently, an insulating film LF2 formed of silicon oxide, for example, is deposited over the substrate SUB by CVD or the like, and thereafter a contact hole is formed in the insulating films LF1 and LF2 by lithography and dry etching.

Thereafter, a metal film such as aluminum (Al) or tungsten (W) is deposited over the substrate SUB by sputtering or the like, which is subsequently patterned by lithography and dry etching to form an electrode EP over the insulating film LF2. The electrode EP is electrically coupled to the semiconductor regions CHp, CHn, HHp and HHn through the contact hole. Thereafter, a semiconductor device is manufactured through the normal processes for the MOSFET.

According to the present first embodiment as thus described, the semiconductor regions HLp, HHp, HLn and HHn for the source and drain of the MOSFETs Qhp and Qhn of the high-voltage region HV can be formed with a deep depth and a smooth impurity distribution. As a result, the reliability and the breakdown voltage of the MOSFETs Qhp and Qhn of the high-voltage region HV can be ensured.

In addition, since the hard mask film HM is formed thin in the core region C, peeling of the hard mask film HM or collapse of a pattern formed of the dummy gate film DG and the hard mask film HM can be prevented at patterning of the dummy gate film DG. As a result, the reliability and yield of the semiconductor device can be improved.

In addition, although the dummy gate film HM is formed thin in the core region C, a small ion implantation energy suffices since a shallow joint is required when forming the semiconductor regions CLp, CLn, CHp and CHn. Additionally, in the present first embodiment, since no annealing is performed to activate impurities before implanting ions to form the semiconductor regions CLp, CLn, CHp and CHn of the core region C, and also there occurs no reduction of ability of preventing impurity ions due to expansion of the grain of the dummy gate film DG. Accordingly, it does not occur that impurity ions penetrate through the hard mask film HM and the dummy gate DG when implanting ions in order to form the semiconductor regions CLp, CLn, CHp and CHn of the core region C. Therefore, the reliability and electric characteristics of the MOSFETs Qcp and Qcn of the core region C can also be ensured.

(Second Embodiment)

In the present second embodiment, an exemplary manufacturing method of a semiconductor device will be described, referring to FIGS. 26 to 41, which raises the height of the memory gate higher than that of the first embodiment in order to lower the resistance of the memory gate of the memory region M. FIGS. 26 to 41 are main part cross-sectional views during the process of manufacturing the semiconductor device of the present second embodiment.

Figure 26:
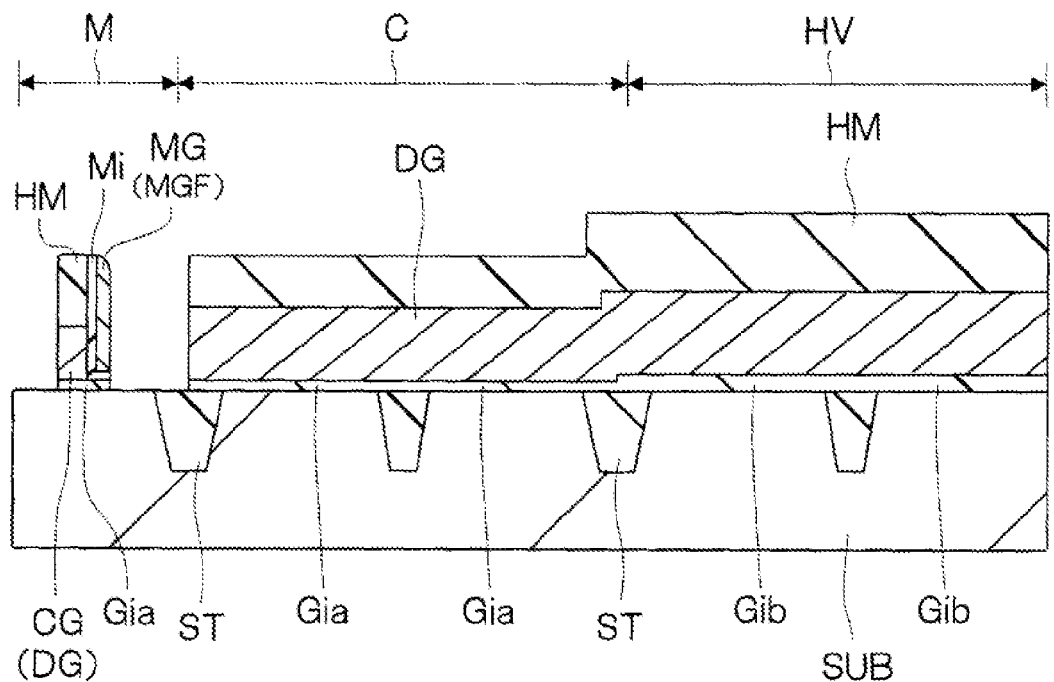
FIG. 26 is a main part cross-sectional view in a process of manufacturing a semiconductor device of an embodiment.

First, after having gone through the processes described referring to FIGS. 1 to 10, the memory gate MG formed of the memory gate film MGF via the memory insulating film Mi is formed on one of the lateral sides of the pattern of the control gate CG and the hard mask film HM thereon, as illustrated in FIG. 26.

In the present second embodiment, the height of the memory insulating film Mi and the memory gate MG is raised higher than that of the first embodiment by reducing the amount of etching when performing the etch back process described referring to FIG. 9 of the first embodiment.

Figure 27:
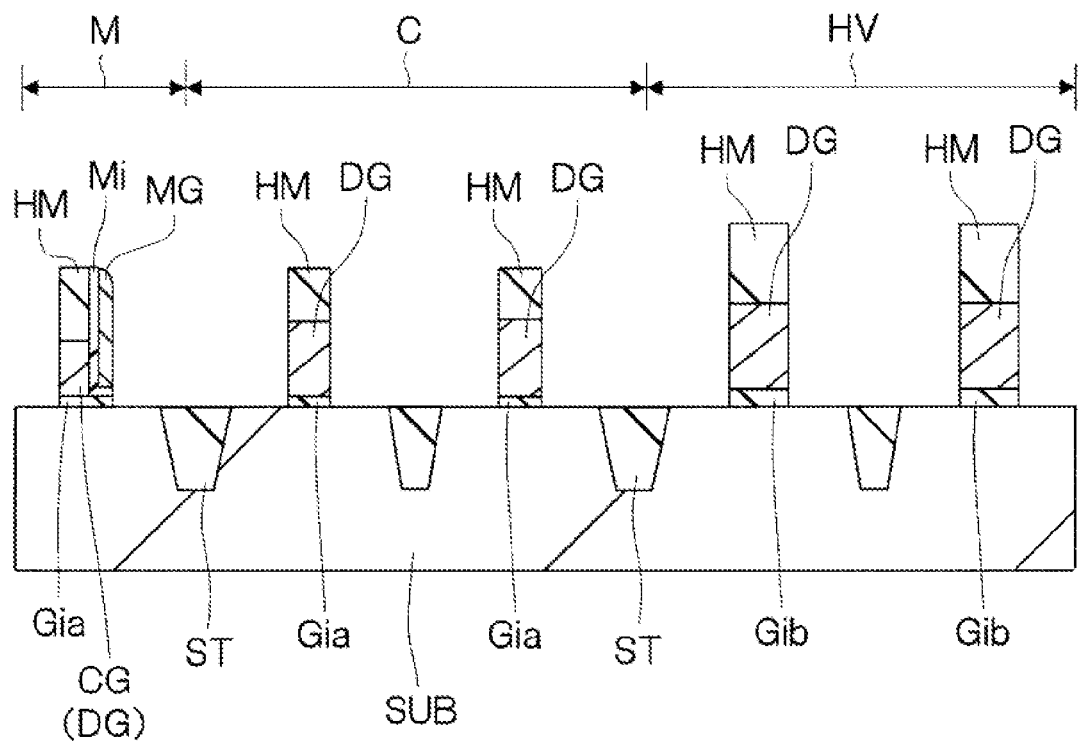
FIG. 27 is a main part cross-sectional view during the process of manufacturing the semiconductor device continuing from FIG. 26.

Subsequently, in a similar manner as described referring to FIG. 12, a pattern formed of the dummy gate film DG and the hard mask film HM thereon is provided in the core region C and the high-voltage region HV, as illustrated in FIG. 27. The size of the pattern of the dummy gate film DG and the hard mask film HM thereon provided in the core region C and the high-voltage region HV is the same as that of the first embodiment.

Figure 28:
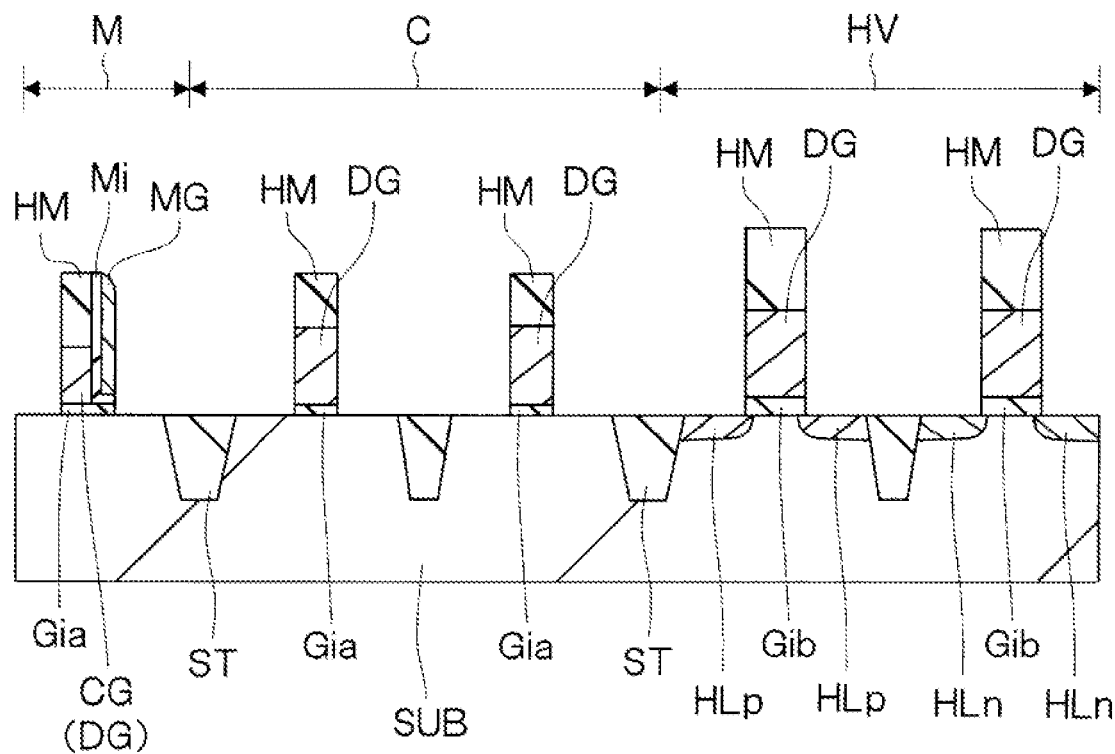
FIG. 28 is a main part cross-sectional view during the process of manufacturing the semiconductor device continuing from FIG. 27.

Thereafter, in a similar manner as described referring to FIG. 13, the p$^-$-type semiconductor region HLp and the n$^-$-type semiconductor region HLn having a low impurity concentration for the LDD are formed in the high-voltage region HV, as illustrated in FIG. 28.

Figure 29:
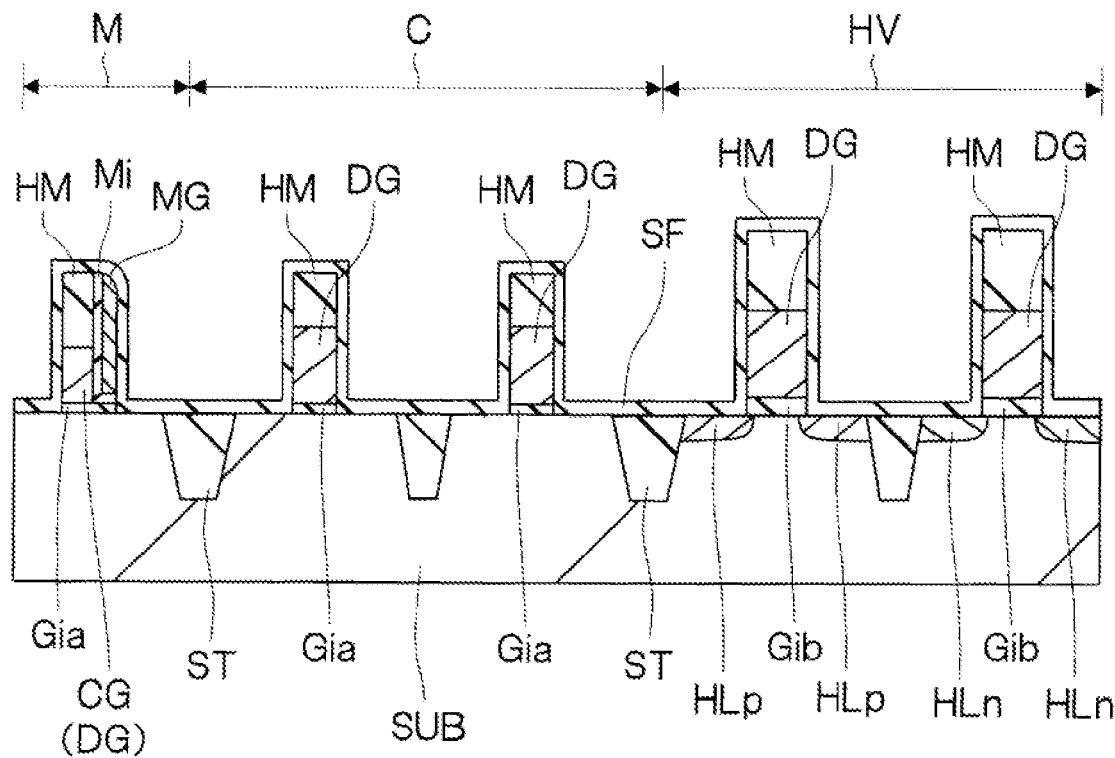
FIG. 29 is a main part cross-sectional view during the process of manufacturing the semiconductor device continuing from FIG. 28.

Subsequently, in a similar manner as described referring to FIG. 14, the spacer film SF for offset is formed, as illustrated in FIG. 29.

Figure 30:
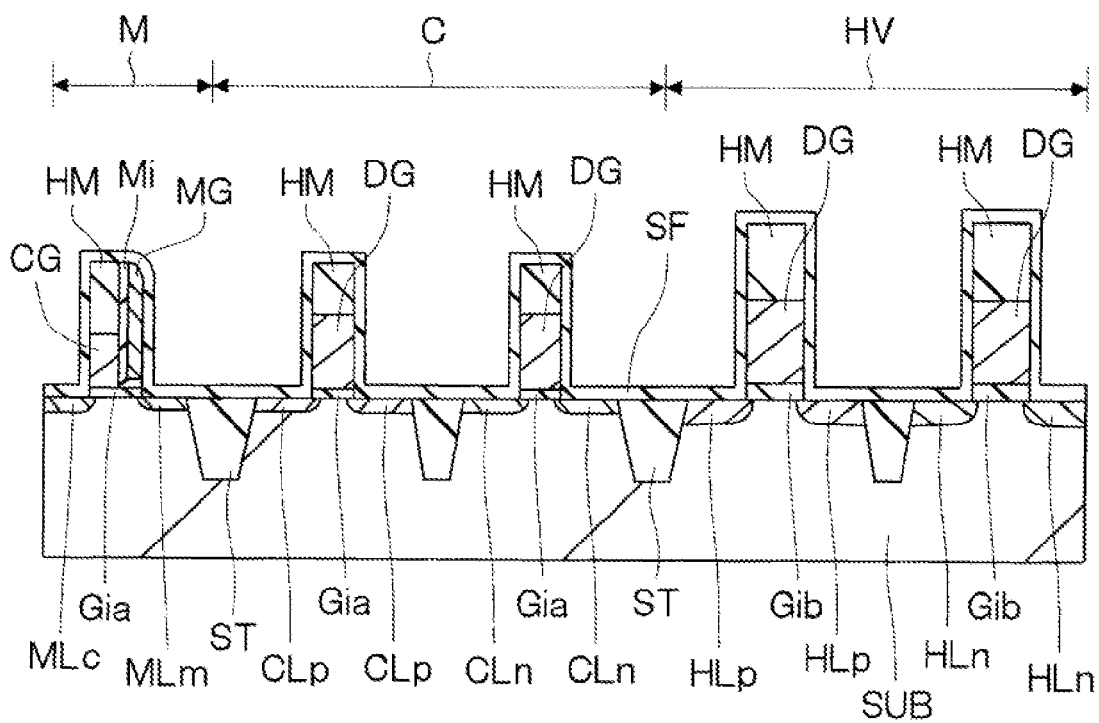
FIG. 30 is a main part cross-sectional view during the process of manufacturing the semiconductor device continuing from FIG. 29.

Subsequently, in a similar manner as described referring to FIG. 15, the p$^-$-type semiconductor region CLp and the n$^-$-type semiconductor region CLn having a low impurity concentration for the LDD is formed in the core region C, as illustrated in FIG. 30 and, additionally, the n$^-$-type semiconductor regions MLm and MLc having a low impurity concentration are formed in the memory region M.

Figure 31:
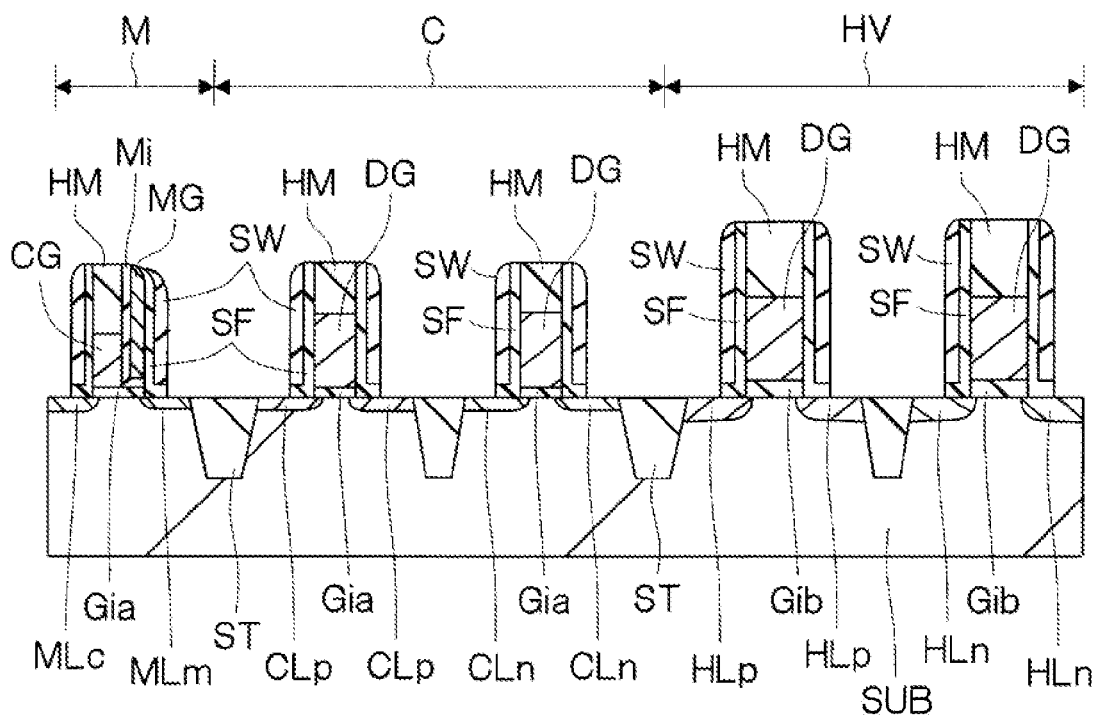
FIG. 31 is a main part cross-sectional view during the process of manufacturing the semiconductor device continuing from FIG. 30.

Thereafter, in a similar manner as described referring to FIG. 16, the side wall SW is formed, as illustrated in FIG. 31.

Figure 32:
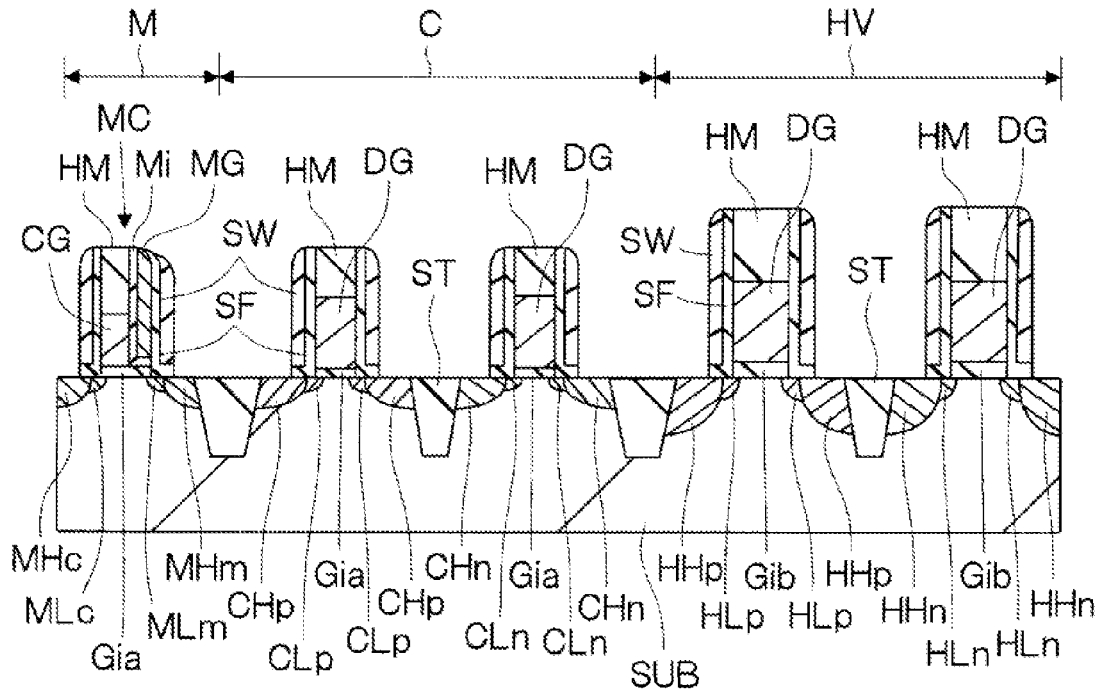
FIG. 32 is a main part cross-sectional view during the process of manufacturing the semiconductor device continuing from FIG. 31.

Subsequently, in a similar manner as described referring to FIG. 17, the high-impurity-concentration p$^+$-type semiconductor region HHp and n$^+$-type semiconductor region HHn for the source and drain are formed in the high-voltage region HV, as illustrated in FIG. 32. In addition, the high-impurity-concentration p$^+$-type semiconductor region CHp and n$^+$-type semiconductor region CHn for the source and drain are formed in the core region C. In addition, the high-impurity-concentration n$^+$-type semiconductor regions MHm and MHc are formed in the memory region M to form a split-gate memory.

Subsequently, in a similar manner as the first embodiment, annealing is performed over the substrate SUB to activate impurities of the semiconductor regions HLp, HHp, HLn, HHn, CLp, CHp, CLn, CHn, MLm, MHm, MLc and MHc.

Figure 33:
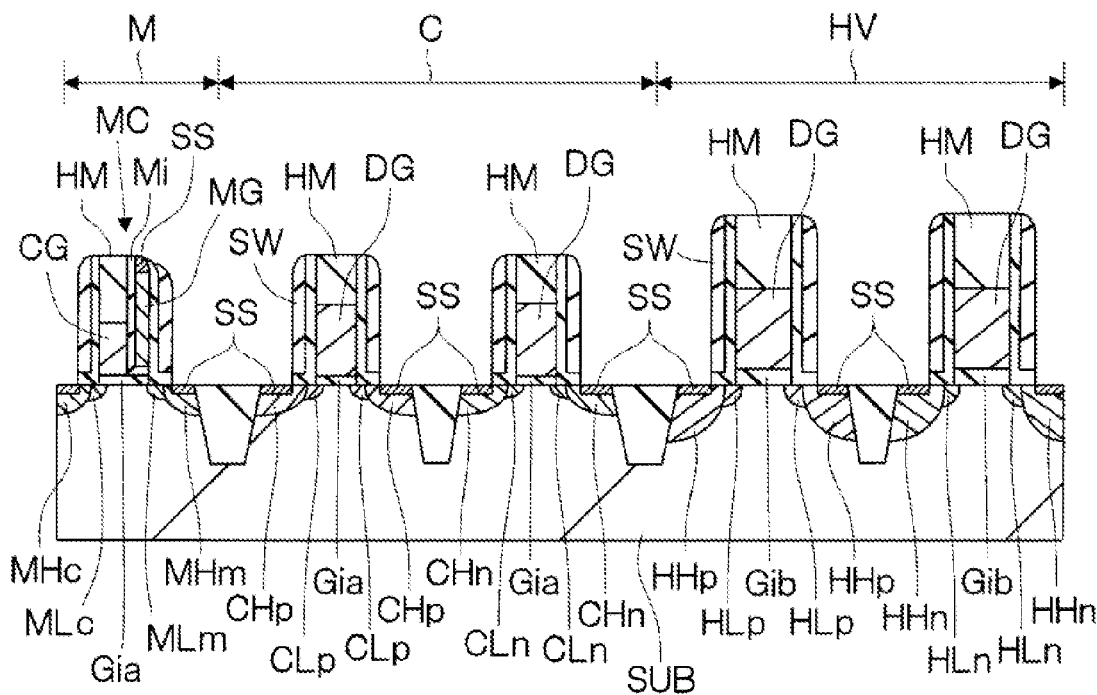
FIG. 33 is a main part cross-sectional view during the process of manufacturing the semiconductor device continuing from FIG. 32.

Thereafter, in a similar manner as described referring to FIG. 18, the silicide SS is formed on a part of the substrate SUB and the memory gate MG, as illustrated in FIG. 33. In the present second embodiment, the height of the memory gate MG is made high and therefore the upper part of the memory gate MG is also subjected to silicidation.

Figure 34:
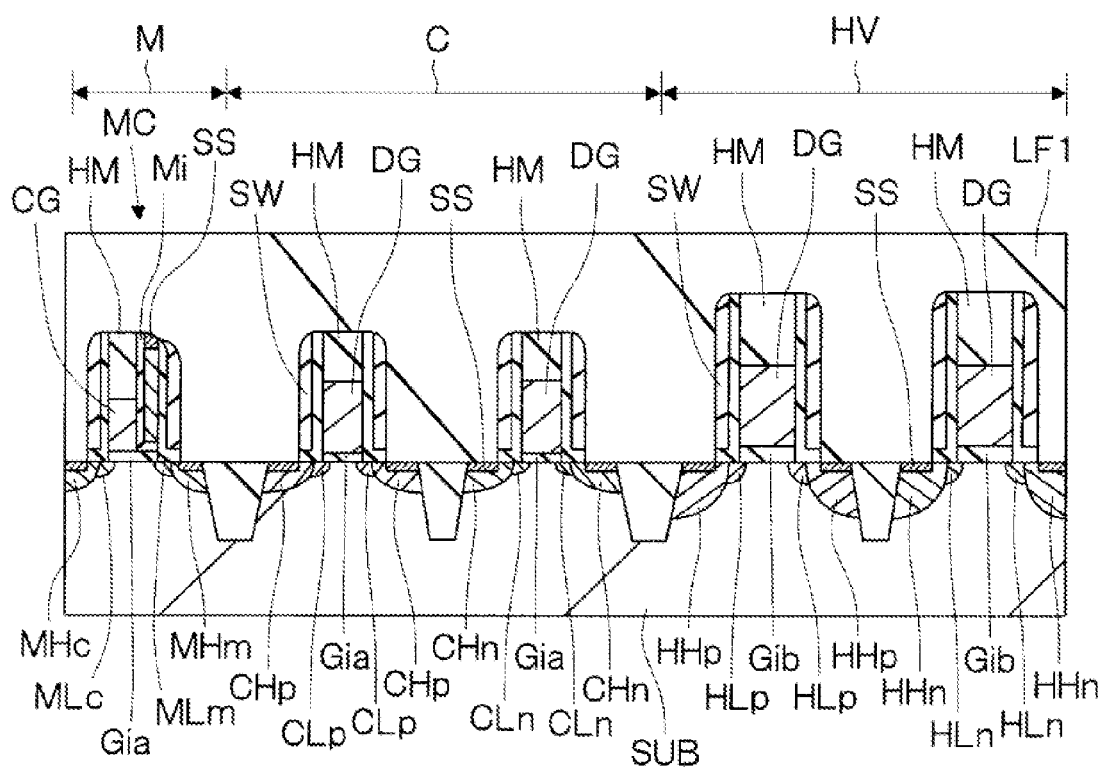
FIG. 34 is a main part cross-sectional view during the process of manufacturing the semiconductor device continuing from FIG. 33.
Figure 35:
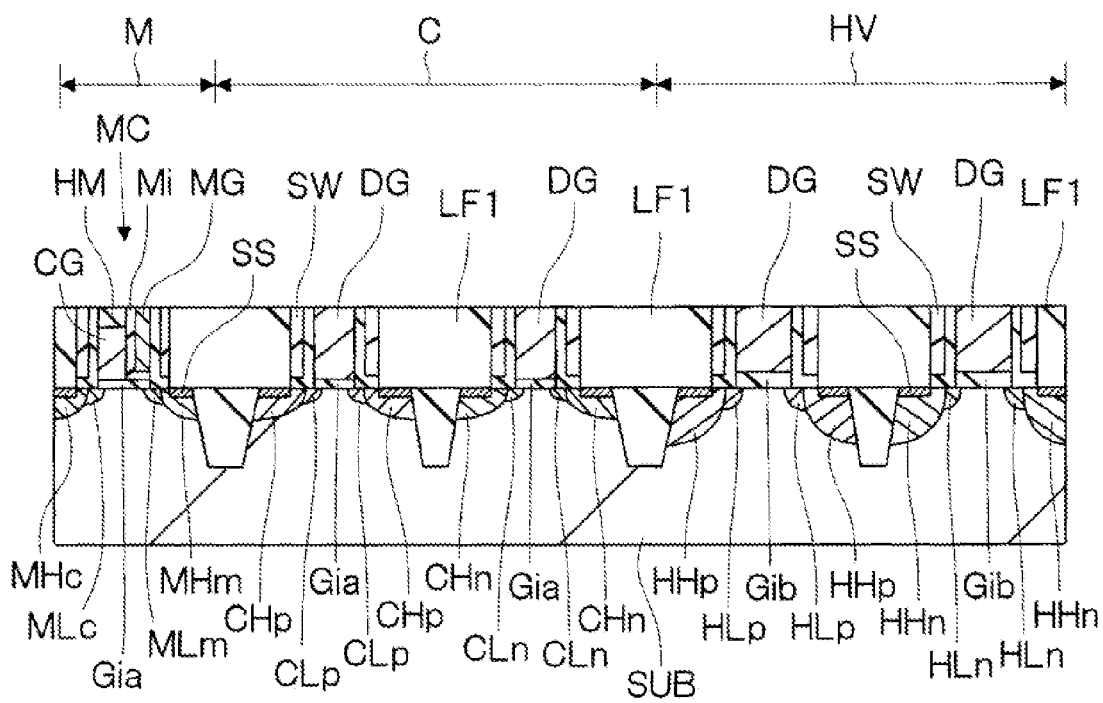
FIG. 35 is a main part cross-sectional view during the process of manufacturing the semiconductor device continuing from FIG. 34.

Subsequently, after having deposited the insulating film LF1 over the substrate SUB, as illustrated in FIG. 34, in a similar manner as described referring to FIG. 19, the upper part of the insulating film LF1 is removed by CMP until the upper surface of the dummy gate film DG of the core region C and the high-voltage region HV is exposed, as illustrated in FIG. 35, in a similar manner as described referring to FIG. 20. In this occasion, the silicide SS at the upper part of the memory gate MG is also removed. In addition, the upper surface height of the memory gate MG becomes equal to the upper surface height of the hard mask film HM over the upper surface of the control gate CG.

Figure 36:
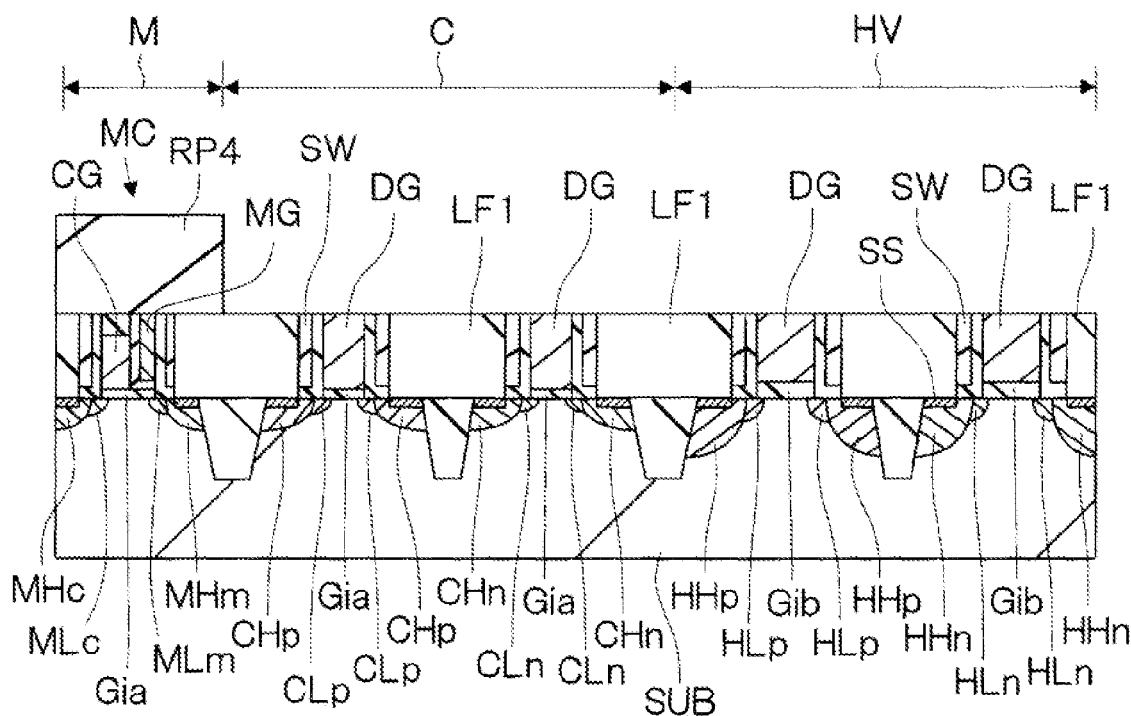
FIG. 36 is a main part cross-sectional view during the process of manufacturing the semiconductor device continuing from FIG. 35.

Subsequently, as illustrated in FIG. 36, a resist pattern RP4 is formed in the memory region M by lithography so as to cover the memory gate MG. A pattern of the hard mask film may be formed by lithography and etching instead of the resist pattern RP4. This is an etching mask provided to prevent the memory gate MG from being removed in the subsequent process.

Figure 37:
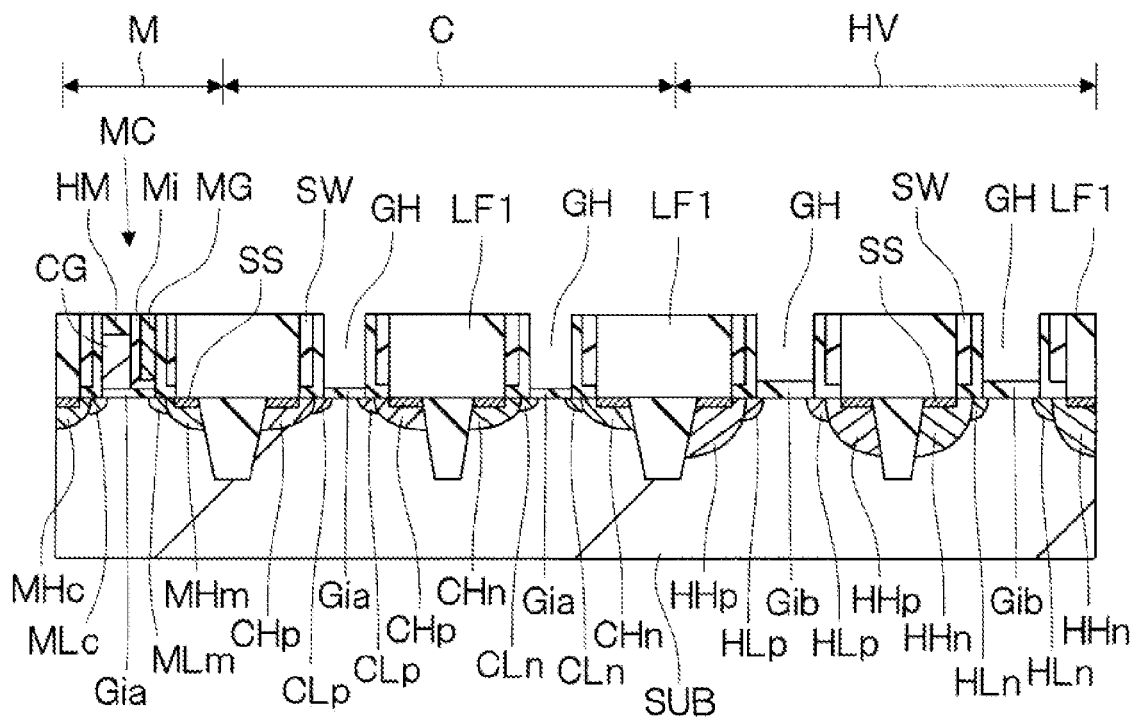
FIG. 37 is a main part cross-sectional view during the process of manufacturing the semiconductor device continuing from FIG. 36.

Thereafter, in a similar manner as described referring to FIG. 21, the dummy gate film DG of the core region C and the high-voltage region HV is removed, as illustrated in FIG. 37. Accordingly, removing the dummy gate film DG forms the opened recess GH in the insulating film LF1 of the core region C and the high-voltage region HV. Thereafter, the resist pattern RP4 or the hard mask film is removed.

Figure 38:
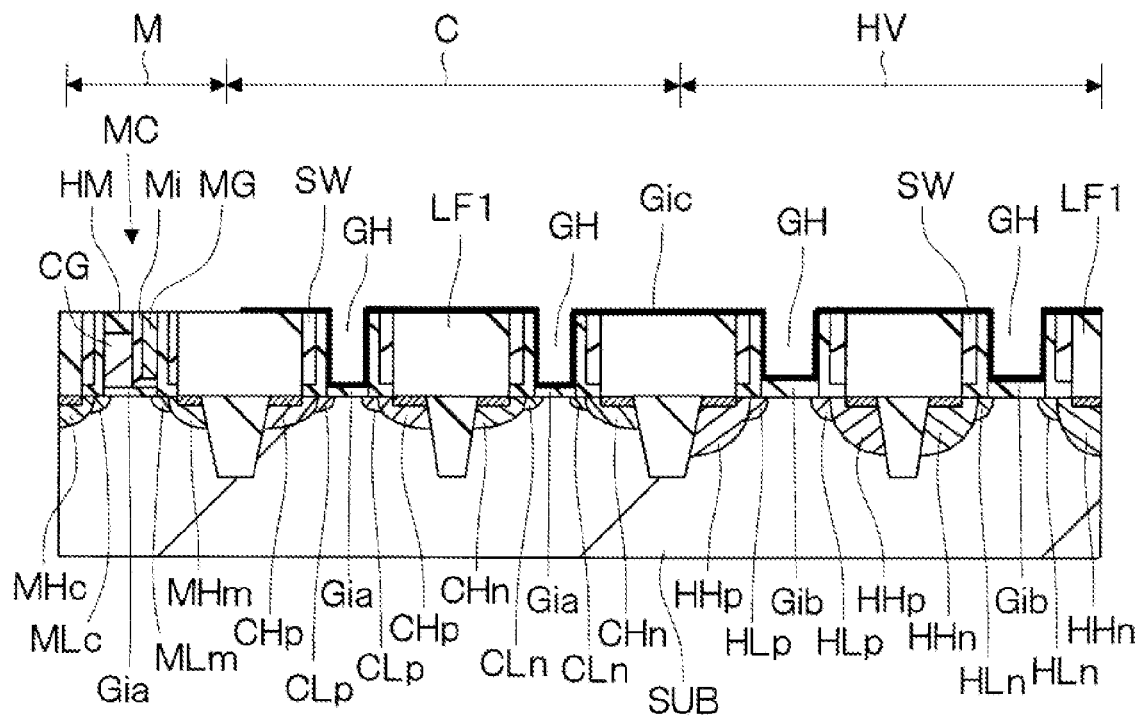
FIG. 38 is a main part cross-sectional view during the process of manufacturing the semiconductor device continuing from FIG. 37.

Subsequently, in a similar manner as described referring to FIG. 22, the high-k gate insulating film Gic is deposited over the substrate SUB, as illustrated in FIG. 38. The gate insulating film Gic is adhered in the recess GH of the core region C and the high-voltage region HV.

Figure 39:
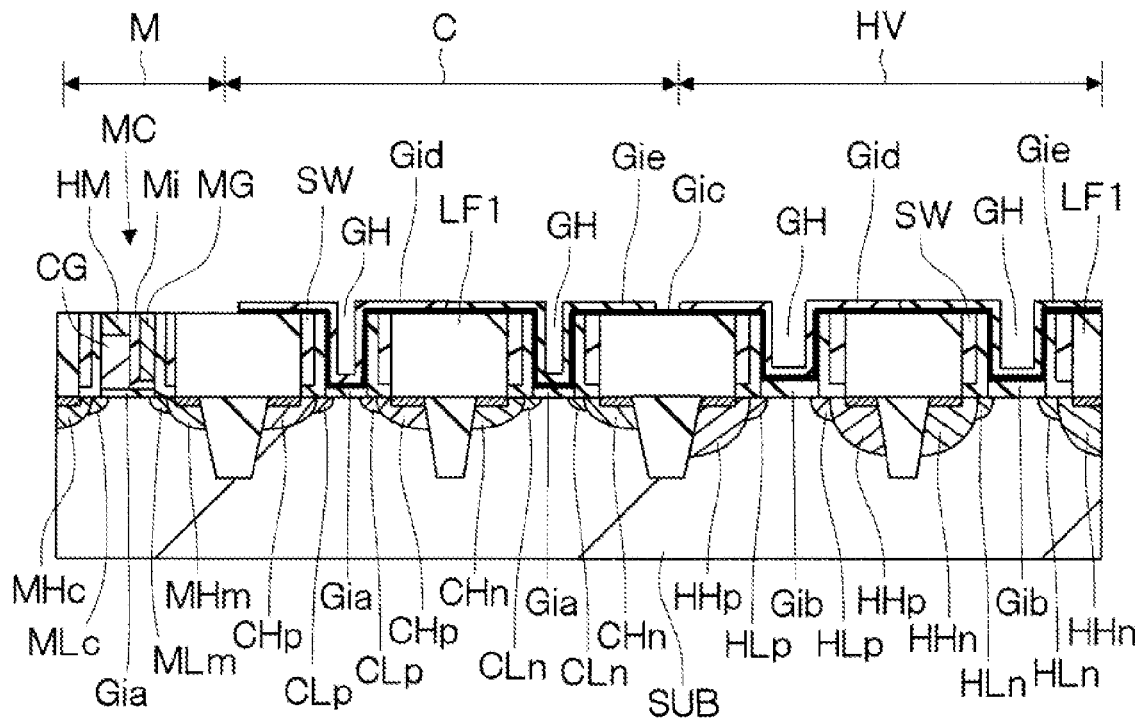
FIG. 39 is a main part cross-sectional view during the process of manufacturing the semiconductor device continuing from FIG. 38.

Subsequently, in a similar manner as described referring to FIG. 23, the high-k gate insulating films Gid and Gie are formed in the formation regions of p-channel and n-channel MOSFETs, as illustrated in FIG. 39. The gate insulating films Gid and Gie are adhered in the recess GH of the core region C and the high-voltage region HV.

Figure 40:
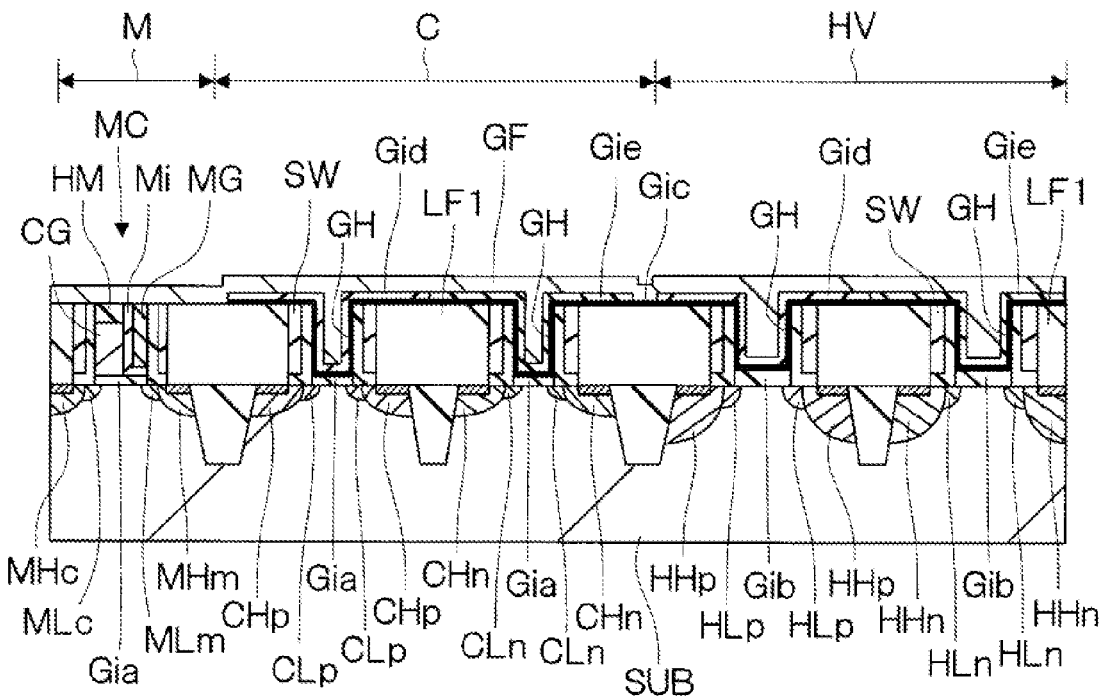
FIG. 40 is a main part cross-sectional view during the process of manufacturing the semiconductor device continuing from FIG. 39.

Thereafter, in a similar manner as described referring to FIG. 24, the gate film GF for work function adjustment is deposited over the substrate SUB by sputtering, CVD, or the like as illustrated in FIG. 40. The gate film GF is buried in the recess GH of the core region C and the high-voltage region HV.

Figure 41:
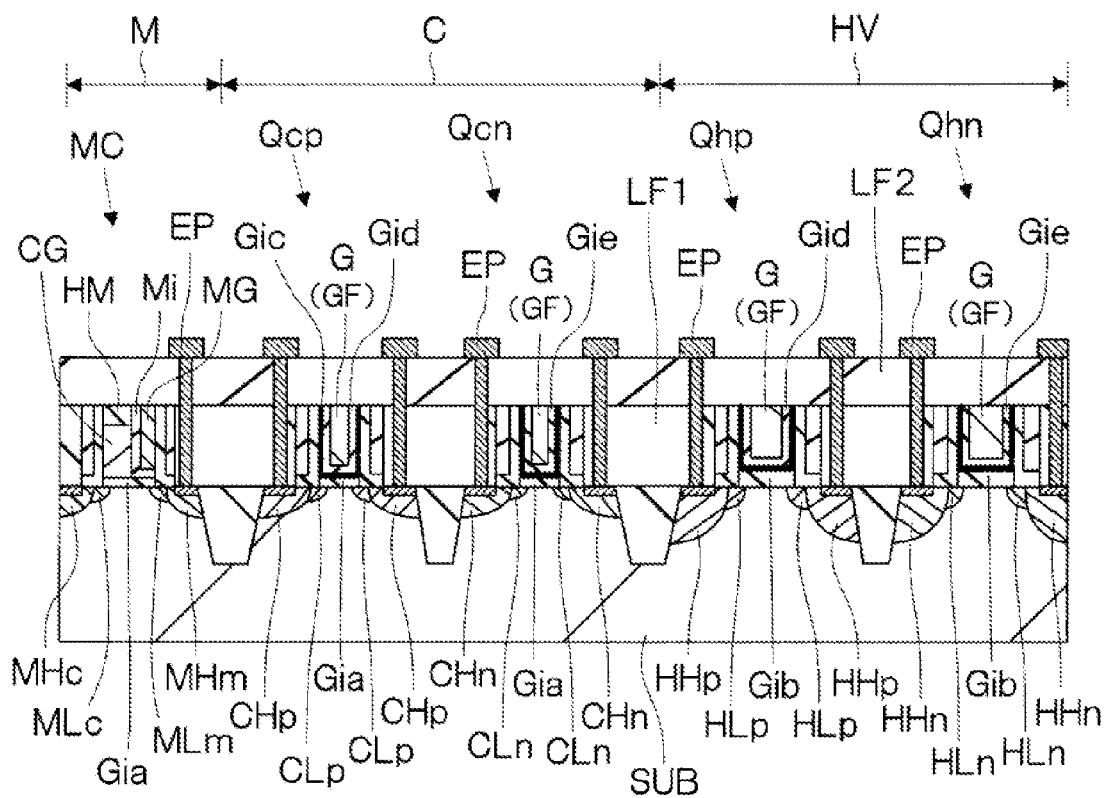
FIG. 41 is a main part cross-sectional view during the process of manufacturing the semiconductor device continuing from FIG. 40.

Subsequently, in a similar manner as described referring to FIG. 25, the gate film GF is removed by CMP or the like, as illustrated in FIG. 41 to form, in the recess GH of the core region C and the high-voltage region HV, the gate electrode G formed of the gate film GF. Accordingly, the p-channel and n-channel MOSFETs Qcp and Qcn are formed in the core region C, and the p-channel and n-channel MOSFETs Qhp and Qhn having a high breakdown voltage are formed in the high-voltage region HV. Subsequent processes are similar to those described with the first embodiment and thus explanation thereof is omitted.

According to the present second embodiment described above, the following effect can be obtained besides the effect brought about by the first embodiment.

Specifically, having formed the memory gate MG so that the upper surface height of the memory gate MG is the same as the upper surface height of the hard mask film HM over the control gate CG allows the cross-sectional area of the memory gate MG to be larger than that of the first embodiment, and therefore the resistance of the memory gate MG can be smaller than that of the first embodiment. Accordingly, the RC time constant of the memory circuit can be reduced lower than that of the first embodiment and therefore it is possible to raise the operation speed of the memory circuit higher than that of the first embodiment.

(Third Embodiment)

Figure 42:
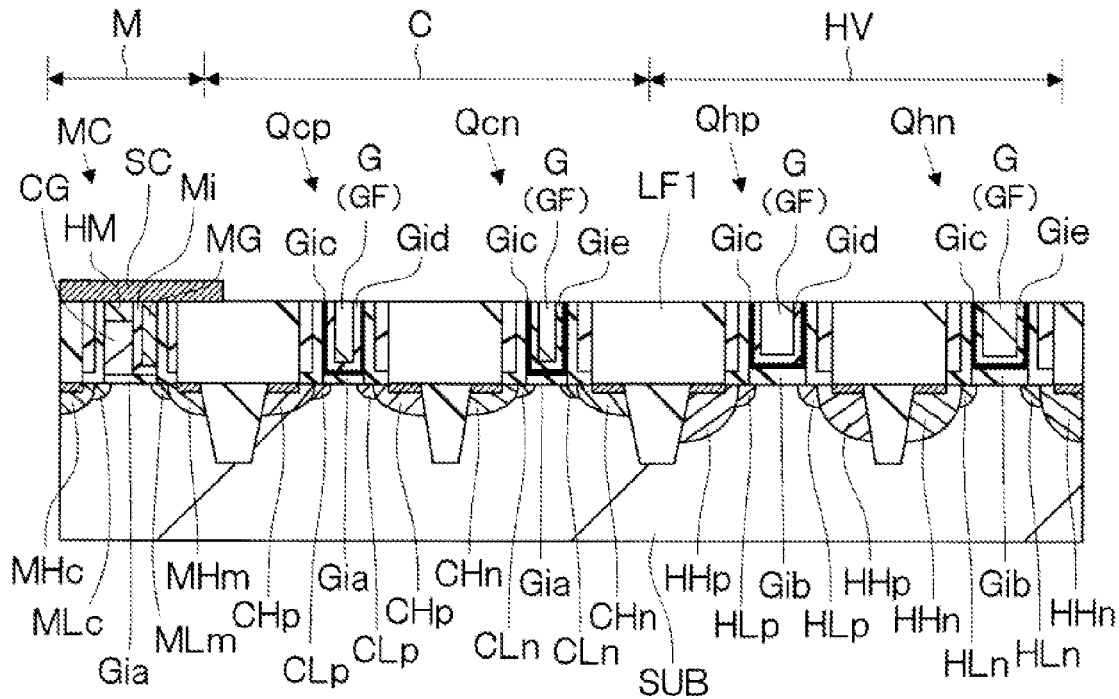
FIG. 42 is a main part cross-sectional view during a process of manufacturing a semiconductor device of an embodiment.
Figure 43:
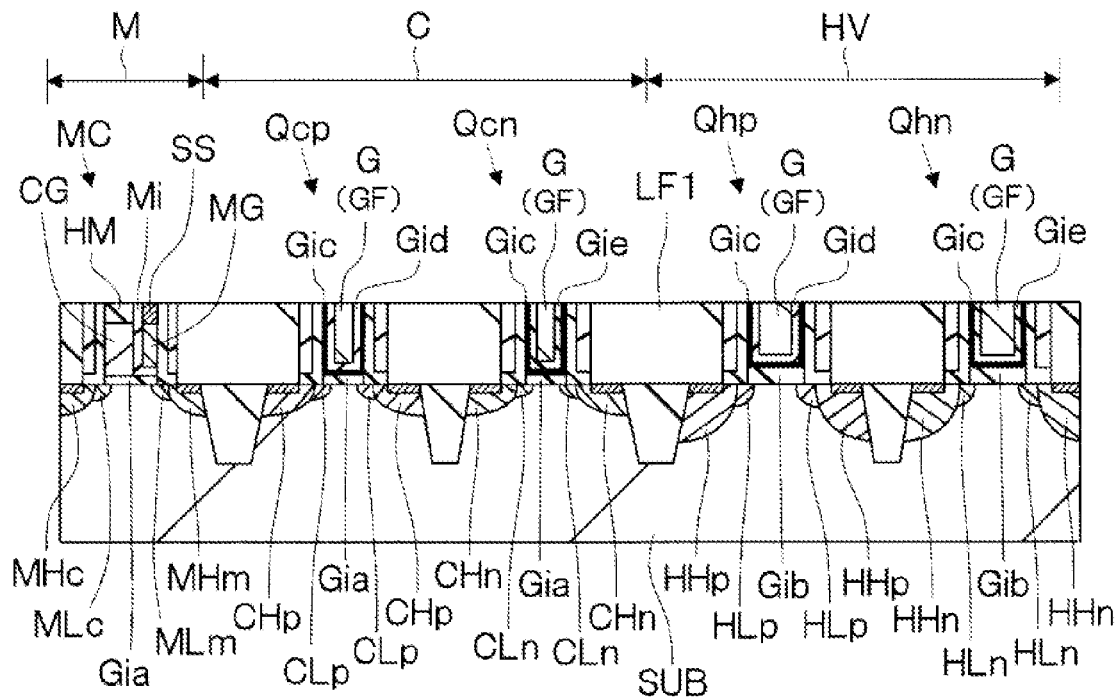
FIG. 43 is a main part cross-sectional view during the process of manufacturing the semiconductor device continuing from FIG. 42.

In the present third embodiment, an exemplary manufacturing method of semiconductor device will be described, referring to FIGS. 42 and 43, which subjects the upper part of the memory gate to silicidation in order to lower the resistance of the memory gate of the memory region M. FIGS. 42 and 43 are main part cross-sectional views during the process of manufacturing a semiconductor device of the present third embodiment.

First, after having gone through the processes described referring to FIGS. 26 to 41 of the second embodiment, and having formed, in the recess GH of the core region C and the high-voltage region HV, the gate electrode G formed of the gate film GF, a pattern of a conductor film SC for silicide formation is formed in the memory region M, as illustrated in FIG. 42. The conductor film SC is formed by depositing a conductor film such as, for example, nickel platinum by sputtering or the like, and subsequently performing patterning thereon by lithography and etching.

Subsequently, performing annealing on the substrate SUB causes a reaction between the conductor film SC and the memory gate MG to form the silicide SS on the upper part of the memory gate MG, as illustrated in FIG. 43. The upper part of the control gate CG is covered with the hard mask film HM, and therefore is not subjected to silicidation. Accordingly, there is no risk of a short-circuit between the memory gate MG and the control gate CG due to silicidation of the upper part of the memory gate MG. Subsequent processes are similar to those described with the first and second embodiments and thus explanation thereof is omitted.

According to the present third embodiment described above, the following effect can be obtained besides the effect brought about by the second embodiment.

Specifically, having formed the silicide SS over the upper part of the memory gate MG allows the resistance of the memory gate MG to be smaller than that of the second embodiment. Accordingly, the RC time constant of the memory circuit can be reduced lower than that of the second embodiment and therefore it is possible to raise the operation speed of the memory circuit higher than that of the second embodiment.

(Fourth Embodiment)

Figure 44:
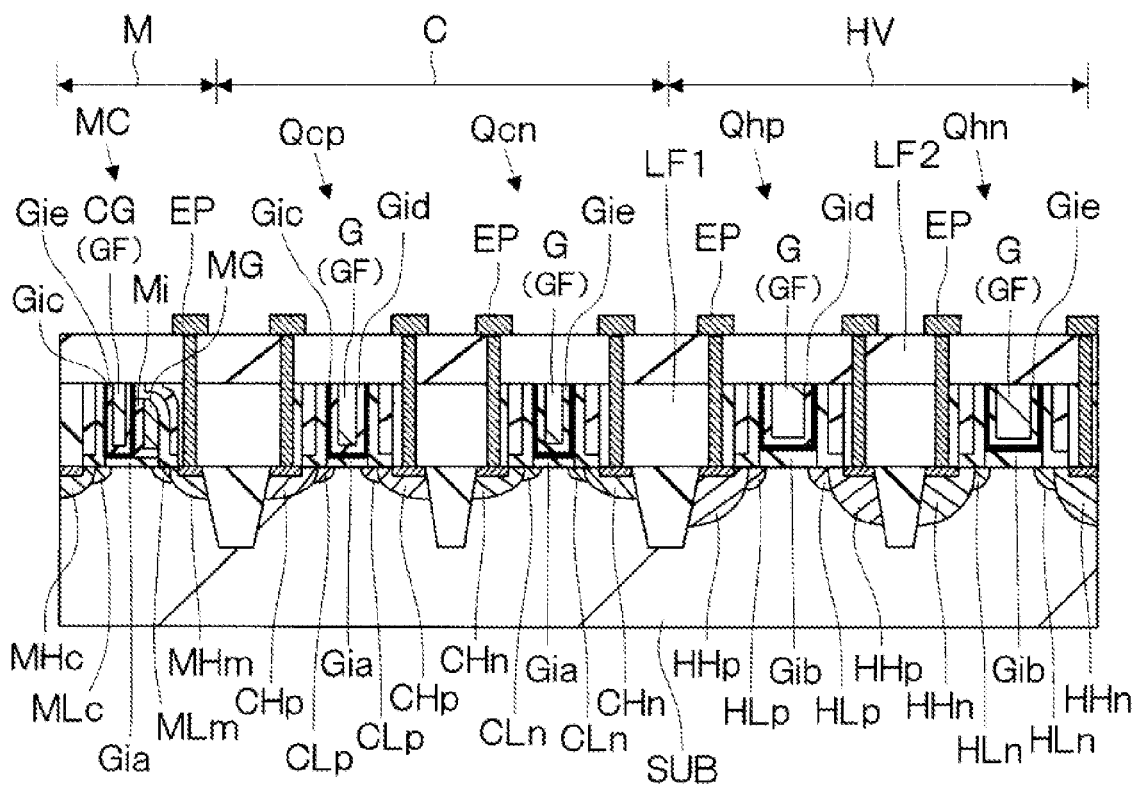
FIG. 44 is a main part cross-sectional view of a semiconductor device of an embodiment.

FIG. 44 is a main part cross-sectional view of the semiconductor device of the present fourth embodiment.

In the present fourth embodiment, the control gate CG of the memory region M is formed of the conductor film containing metal such as TiN, for example, as a main component. In addition, the gate insulating film under the control gate CG has high-k insulating films (gate insulating films Gic and Gie).

Other processes are similar to those described with the second embodiment and thus explanation thereof is omitted. A structure with the height of the memory gate MG being lower than the height of the control gate CG as with the first embodiment may be employed, or a structure having the silicide SS formed on the upper part of the memory gate MG as with the third embodiment may be employed.

According to the semiconductor device of the present fourth embodiment described above, the following effect can be obtained besides the effects brought about by the first to third embodiments.

Since the control gate CG of memory cell MC has a laminated structure of the high-k gate insulating films Gic and Gle, and the metal film, it is possible to improve the short channel characteristics and shorten the gate length of the control gate CG. The memory cell MC may require a capacity of several megabits and therefore the area occupied by a memory array including a plurality of memory cells MC may increase. According to the present fourth embodiment, the gate length of individual memory cells MC in the memory array can be shortened and therefore the area occupied by the memory array can be reduced.

In addition, changing the material quality or condition of forming the high-k gate insulating films Gic and Gie and the metal film in the control gate CG of the memory cell MC allows setting the threshold voltage of the control gate CG in a wider range. Accordingly, it is also possible to set the impurity concentration of the substrate SUB under the control gate CG in a wider range. Although a hot carrier is generated or tunneling is used when writing into or erasing the memory, the setting is related to the impurity concentration of the substrate SUB under the control gate CG, the impurity concentration of the substrate SUB under the memory gate MG, the impurity concentration of the drain or source, or the like. According to the present fourth embodiment, the impurity concentration of the substrate SUB under the control gate CG can be set in a wide range and therefore controllability of the memory can be enhanced.

Next, an exemplary manufacturing method of the semiconductor device of the present fourth embodiment will be described, referring to FIGS. 45 to 50. FIGS. 45 to 50 are main part cross-sectional views during the process of manufacturing the semiconductor device of the present fourth embodiment.

Figure 45:
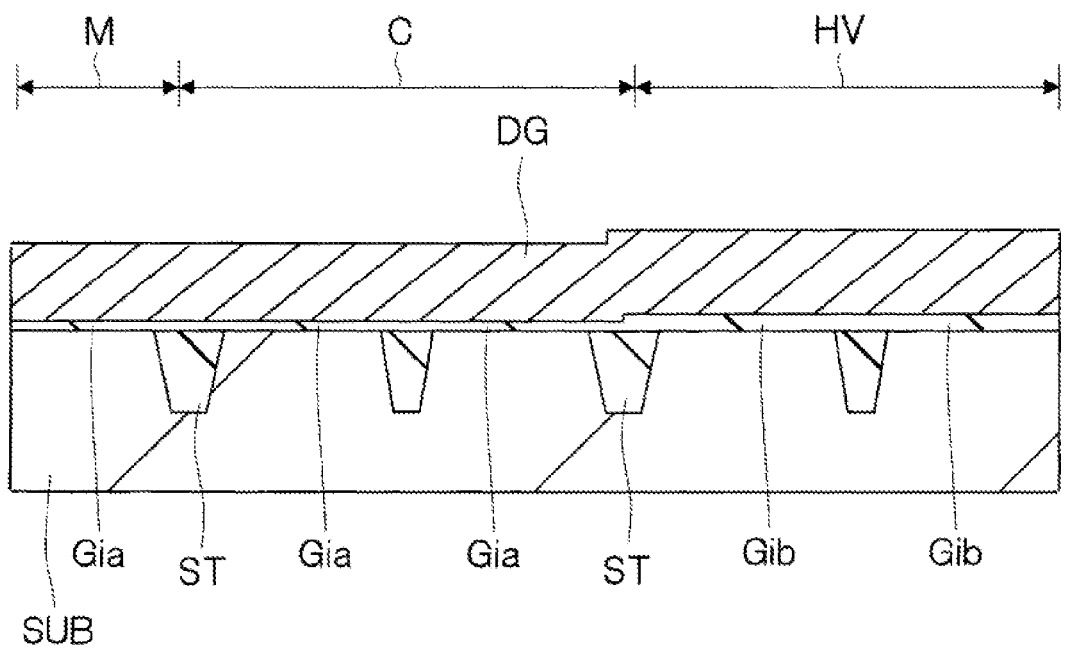
FIG. 45 is a main part cross-sectional view during the process of manufacturing the semiconductor device of FIG. 44.
Figure 46:
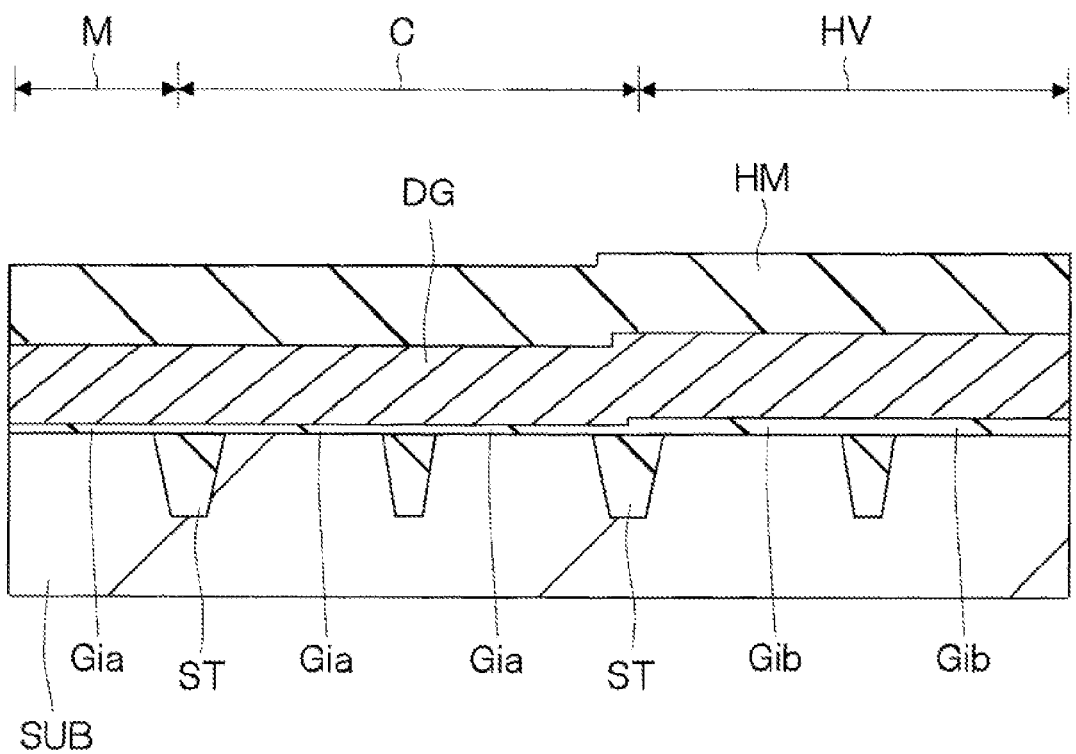
FIG. 46 is a main part cross-sectional view during the process of manufacturing the semiconductor device continuing from FIG. 45.

First, in a similar manner as described referring to FIG. 1, the dummy gate film DG is deposited over the main surface of the substrate SUB via the gate insulating films Gia and Gib, as illustrated in FIG. 45, and subsequently, in a similar manner as described referring to FIG. 4, the hard mask film HM is deposited over the dummy gate film DG, as illustrated in FIG. 46.

Figure 47:
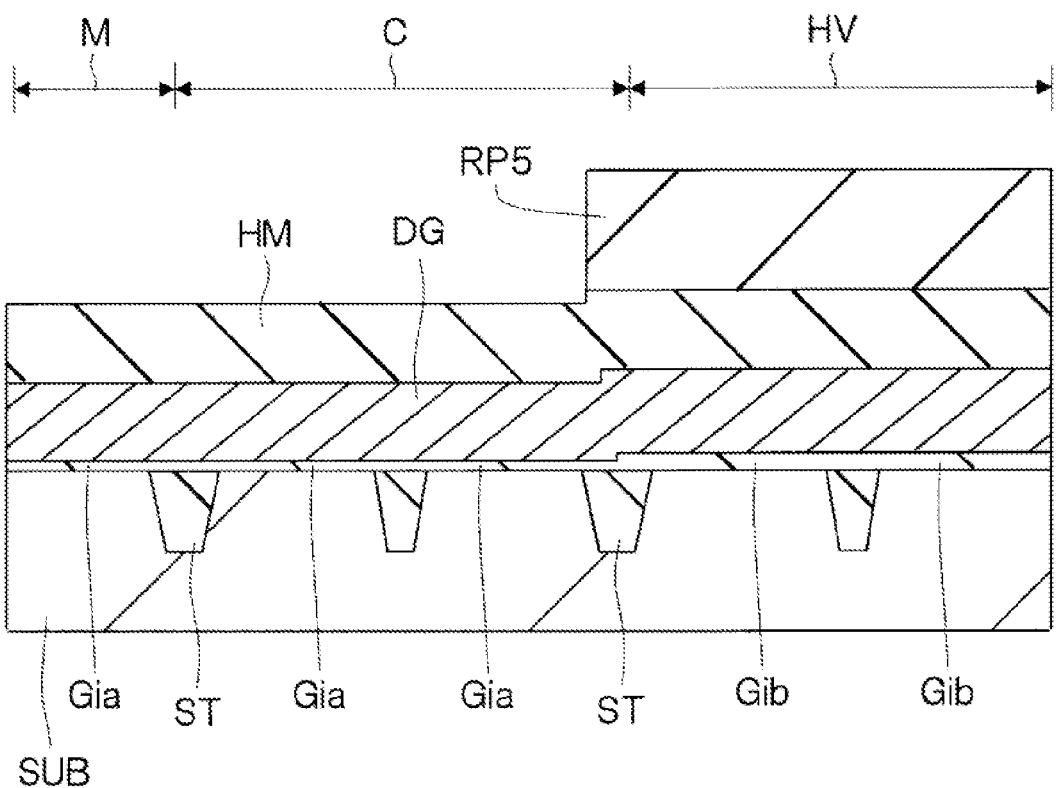
FIG. 47 is a main part cross-sectional view during the process of manufacturing the semiconductor device continuing from FIG. 46.

Subsequently, as illustrated in FIG. 47, a resist pattern RP5 is formed over the hard mask film HM by lithography. The resist pattern RP5 has been patterned so that the high-voltage region HV is covered and the other regions are exposed.

Figure 48:
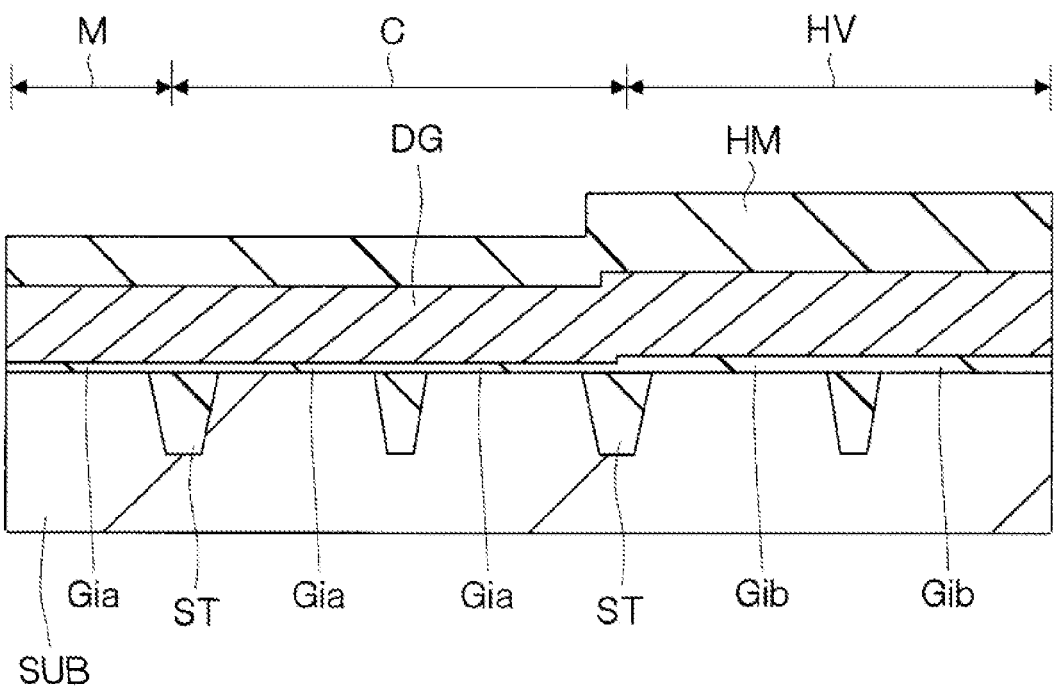
FIG. 48 is a main part cross-sectional view during the process of manufacturing the semiconductor device continuing from FIG. 47.

Thereafter, in a similar manner as described referring to FIG. 6, the upper part of the hard mask film HM of the core region C and the memory region M is removed by approximately 80 nm, for example, by performing dry etching using the resist pattern RP5 as the etching mask, and subsequently the resist pattern RP5 is removed as illustrated in FIG. 48.

As a result, the thickness of the hard mask film HM of the high-voltage region HV becomes thicker than the thickness of the hard mask film HM of the core region C and the memory region M. The thickness of the hard mask film HM of the high-voltage region HV at this stage is about 100 nm, for example, and the thickness of the hard mask film HM is the same for the core region C and the memory region M, being in a range of 20 to 30 nm, for example. The upper surface height of the hard mask film HM is the same for the memory region M and the core region C.

Figure 49:
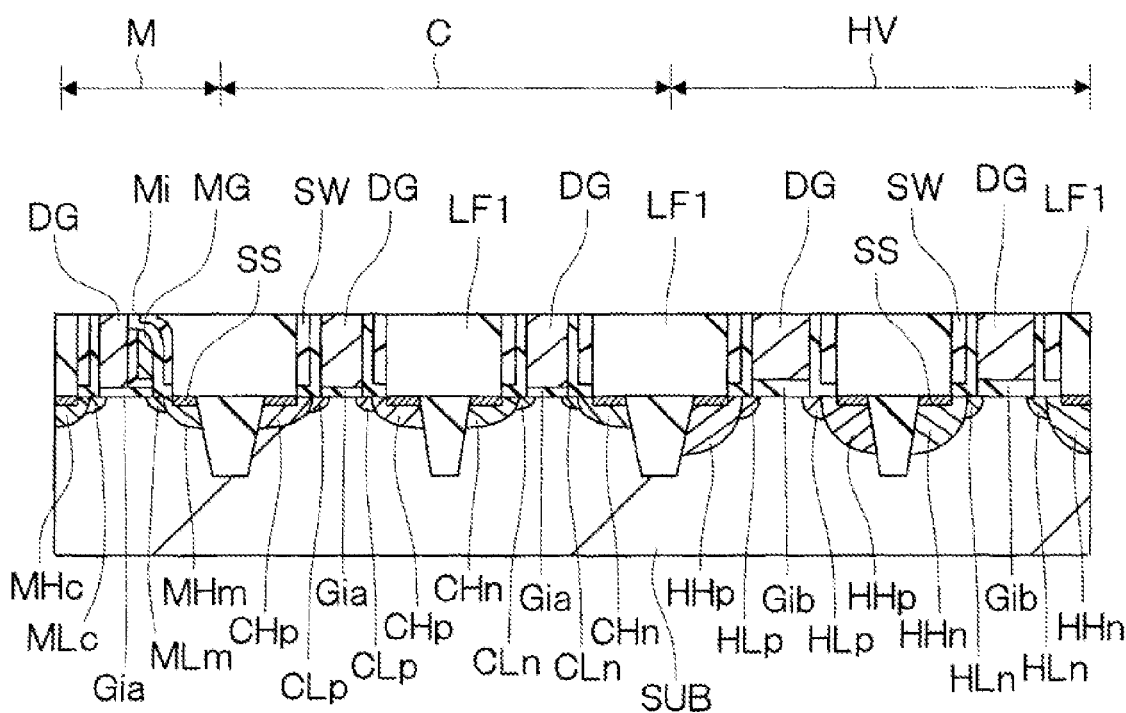
FIG. 49 is a main part cross-sectional view during the process of manufacturing the semiconductor device continuing from FIG. 48.

Subsequently, after having gone through the processes described referring to FIGS. 7 to 20, the insulating film LF1 is formed over the substrate SUB, as illustrated in FIG. 49. Here, the hard mask film HM over the dummy gate film DG of the memory region M, the core region C and the high-voltage region HV is removed to expose the upper surface of the dummy gate film DG.

Figure 50:
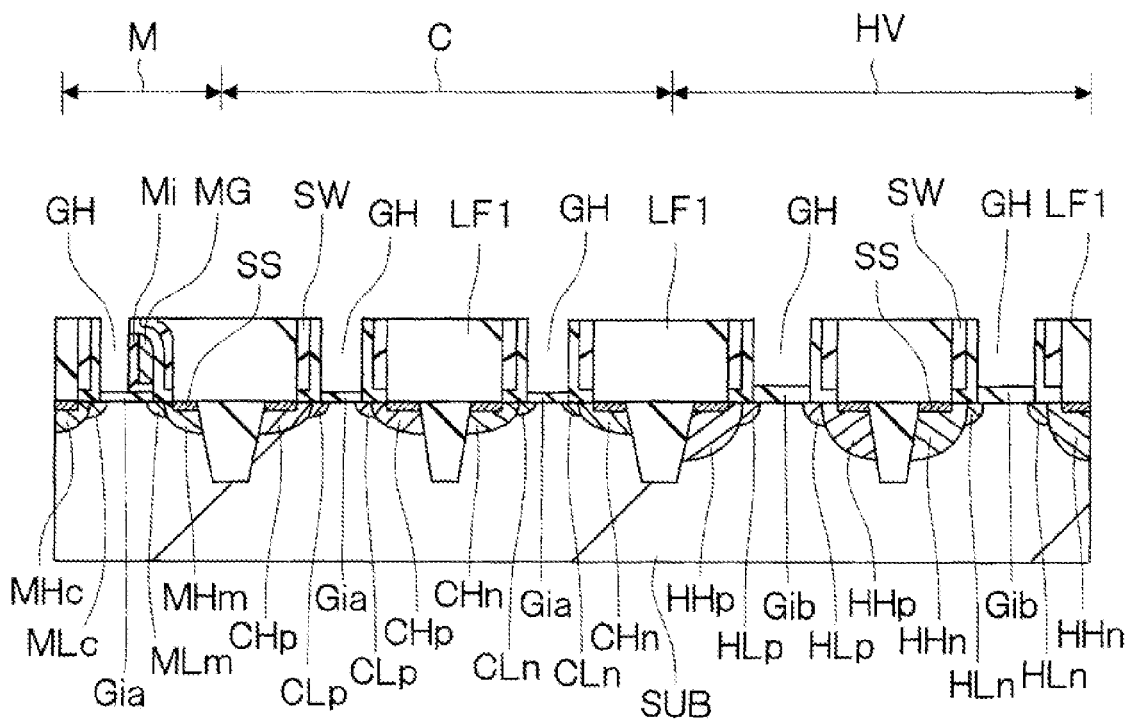
FIG. 50 is a main part cross-sectional view during the process of manufacturing the semiconductor device continuing from FIG. 49.

Subsequently, in a similar manner as described referring to FIG. 21, the dummy gate film DG of the memory region M, the core region C and the high-voltage region HV is removed by wet etching, as illustrated in FIG. 50. As a result, the recess GH is formed in the insulating film LF1 of the memory region M, the core region C and the high-voltage region HV.

Subsequently, after having gone through the processes similar to those described referring to FIGS. 22 to 25, the semiconductor device illustrated in FIG. 44 is manufactured. Here, the gate insulating films Gic and Gie under the control gate CG of the memory region M are formed, when the gate insulating films Gic and Gie under the gate electrode G of the n-channel MOSFETs Qcn and Qhn of the core region C and the high-voltage region HV are formed. In addition, the control gate CG of the memory region M is formed, when the gate electrode G of the core region C and the high-voltage region HV is formed.

Although, hereinbefore, the invention made by the present inventor has been described specifically on the basis of the embodiments, it is needless to say that the present invention is not limited to the above embodiments and can be modified variously in the range not departing from the gist thereof.

For example, although a case of forming the gate electrode by the damascene gate (replacement) method has been described in the embodiments, the gate electrode may be formed by the full silicide method, for example, which performs, after having buried a polysilicon film in a recess, silicidation of the polysilicon film in the recess using a metal film laminated thereon.

What is claimed is:

1. A manufacturing method of a semiconductor device comprising the steps of:
   (a) forming a first insulating film over a semiconductor substrate having a formation region of a first field effect transistor driven by a first power supply voltage, and a formation region of a second field effect transistor driven by a second power supply voltage higher than the first power supply voltage;
   (b) depositing a dummy gate film over the first insulating film;
   (c) depositing a hard mask film over the dummy gate film;
   (d) processing the hard mask film so that thickness of the hard mask film of the formation region of the second field effect transistor becomes thicker than the thickness of the hard mask film of the formation region of the first field effect transistor;
   (e) patterning the dummy gate film and the hard mask film after the step (d);
   (f) after the step (e), forming a semiconductor region for the source and drain of the first field effect transistor;
   (g) after the step (e), forming a semiconductor region for the source and drain of the second field effect transistor;
   (h) after the step (f) and step (g), performing heat treatment to activate the semiconductor regions for the source and drain of the first field effect transistor and the second field effect transistor;
   (i) after the step (h), depositing a second insulating film over the semiconductor substrate and thereafter removing the second insulating film until the dummy gate film is exposed;
   (j) after the step (i), removing the dummy gate film exposed from the second insulating film;
   (k) after the step (j), forming a third insulating film having a dielectric constant higher than the first insulating film in the removal region of the dummy gate film; and
   (l) after the step (k), forming a gate electrode formed of a conductor film containing metal as a main component via the third insulating film in the removal region of the dummy gate film.

2. The manufacturing method of a semiconductor device according to claim 1,
   wherein the step (f) includes the steps of:
      forming a semiconductor region having a relatively low impurity concentration for the source and drain of the first field effect transistor; and
      forming a semiconductor region having a relatively high impurity concentration for the source and drain of the first field effect transistor, and
   wherein the step (g) includes the steps of:
      forming a semiconductor region having a relatively low impurity concentration for the source and drain of the second field effect transistor; and
      forming a semiconductor region having a relatively high impurity concentration for the source and drain of the second field effect transistor.

3. The manufacturing method of a semiconductor device according to claim 2, wherein
   the depth of the low impurity concentration semiconductor region of the second field effect transistor is deeper than the depth of the low impurity concentration semiconductor region of the first field effect transistor, and the depth of the high impurity concentration semiconductor region of the second field effect transistor is deeper than the depth of the high impurity concentration semiconductor region of the first field effect transistor.

4. The manufacturing method of a semiconductor device according to claim 1,
   wherein the semiconductor substrate has a memory region having disposed therein a nonvolatile memory cell in which a control gate and a memory gate are arranged in alignment along the upper surface of the semiconductor substrate via a memory insulating film, and
   wherein the method comprises a step of, after the step (b) and prior to the step (c), processing the dummy gate film of the memory region so that the thickness of the dummy gate film of the memory region becomes thinner than the thickness of the dummy gate film of the formation region of the first field effect transistor and the formation region of the second field effect transistor.

5. The manufacturing method of a semiconductor device according to claim 4,
   wherein the dummy gate film is formed of polycrystalline silicon, and
   wherein the method comprises a step of forming the control gate by the dummy gate film.

6. The manufacturing method of a semiconductor device according to claim 4, comprising a step of
   processing the memory gate so that the height of the upper surface of the memory gate becomes the height of the upper surface of the hard mask film over the upper surface of the control gate formed by the dummy gate film.

7. The manufacturing method of a semiconductor device according to claim 6, comprising a step of
   forming a silicide layer on the upper part of the memory gate.

8. The manufacturing method of a semiconductor device according to claim 1,
   wherein the semiconductor substrate has a memory region having disposed therein a nonvolatile memory cell in which a control gate and a memory gate are arranged in alignment along the upper surface of the semiconductor substrate via a memory insulating film, and
   wherein the method comprises the steps of:
      in the step (i), removing the second insulating film until the dummy gate film of the memory region, the formation region of the first field effect transistor, and the formation region of the second field effect transistor are exposed;
      in the step (j), removing the dummy gate film of the memory region, the formation region of the first field effect transistor, and the formation region of the second field effect transistor;
      in the step (k), forming the third insulating film in the removal region of the dummy gate film of the memory region, the formation region of the first field effect transistor, and the formation region of the second field effect transistor; and
      in the step (l), depositing the conductor film over the semiconductor substrate so as to be buried in the removal region of the dummy gate film of the memory region, the formation region of the first field effect transistor, and the formation region of the second field effect transistor, thereafter, by removing the upper part of the conductor film, forming a control gate formed of the conductor film via the third insulating film in the removal region of the dummy gate film of the memory region, and forming a gate electrode formed of the conductor film via the third insulating film in the removal region of the dummy gate film of the formation region of the first field effect transistor and the formation region of the second field effect transistor.

* * * * *